US011488979B2

(12) United States Patent
Lee et al.

(10) Patent No.: US 11,488,979 B2
(45) Date of Patent: Nov. 1, 2022

(54) SEMICONDUCTOR DEVICE OF THREE-DIMENSIONAL STRUCTURE INCLUDING FERROELECTRIC LAYER

(71) Applicant: SK hynix Inc., Icheon-si (KR)

(72) Inventors: Jae Gil Lee, Seoul (KR); Kun Young Lee, Seoul (KR); Hyangkeun Yoo, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 2 days.

(21) Appl. No.: 17/075,577

(22) Filed: Oct. 20, 2020

(65) Prior Publication Data

US 2021/0366932 A1    Nov. 25, 2021

(30) Foreign Application Priority Data

May 19, 2020    (KR) .......................... 10-2020-0060029

(51) Int. Cl.
| | | |
|---|---|---|
| *H01L 27/11597* | (2017.01) | |
| *H01L 27/1159* | (2017.01) | |
| *H01L 27/11551* | (2017.01) | |
| *H01L 27/11556* | (2017.01) | |
| *H01L 27/11585* | (2017.01) | |

(52) U.S. Cl.
CPC .... *H01L 27/11597* (2013.01); *H01L 27/1159* (2013.01); *H01L 27/11551* (2013.01); *H01L 27/11556* (2013.01); *H01L 27/11585* (2013.01)

(58) Field of Classification Search
CPC ......... H01L 27/11551; H01L 27/11556; H01L 27/11585; H01L 27/1159; H01L 27/11597
See application file for complete search history.

(56) References Cited

U.S. PATENT DOCUMENTS

| | | | |
|---|---|---|---|
| 9,190,533 B2 | 11/2015 | Son et al. | |
| 9,865,608 B2 | 1/2018 | Mueller et al. | |
| 10,825,831 B1* | 11/2020 | Koval | H01L 21/32133 |
| 2018/0308537 A1 | 10/2018 | Karda et al. | |
| 2018/0323200 A1* | 11/2018 | Tang | H01L 27/10805 |
| 2018/0323214 A1 | 11/2018 | Karda et al. | |
| 2020/0212068 A1* | 7/2020 | Lee | H01L 29/42372 |
| 2021/0082957 A1* | 3/2021 | Sakuma | H01L 27/11587 |
| 2021/0202703 A1* | 7/2021 | Rajashekhar | H01L 29/40114 |
| 2021/0257407 A1* | 8/2021 | Han | H01L 27/11582 |
| 2021/0335820 A1* | 10/2021 | Kang | H01L 27/11597 |

FOREIGN PATENT DOCUMENTS

| | | | | |
|---|---|---|---|---|
| JP | 2018037441 A | * | 3/2018 | |
| WO | WO-2018144957 A1 | * | 8/2018 | ......... G11C 16/0483 |

* cited by examiner

*Primary Examiner* — Matthew E Warren

(57) ABSTRACT

A semiconductor device according to an embodiment includes a substrate, and a gate structure disposed over the substrate. The gate structure includes a hole pattern including a central axis extending in a direction perpendicular to a surface of the substrate. The gate structure includes a gate electrode layer and an interlayer insulation layer, which are alternately stacked along the central axis. The semiconductor device includes a ferroelectric layer disposed adjacent to a sidewall surface of the gate electrode layer inside the hole pattern, and a channel layer disposed adjacent to the ferroelectric layer inside the hole pattern. In this case, one of the gate electrode layer and the interlayer insulation layer protrudes toward the central axis of the hole pattern relative to the other one of the gate electrode layer and the interlayer insulation layer.

20 Claims, 19 Drawing Sheets

SEMICONDUCTOR DEVICE OF THREE-DIMENSIONAL STRUCTURE INCLUDING FERROELECTRIC LAYER

CROSS-REFERENCE TO RELATED APPLICATIONS

The present application claims priority under 35 U.S.C. § 119(a) to Korean Application No. 10-2020-0060029, filed on May 19, 2020, which is incorporated herein by reference in its entirety.

BACKGROUND

1. Technical Field

The present disclosure generally relates to a semiconductor device and, more particularly, to a semiconductor device of a three-dimensional structure including a ferroelectric layer.

2. Related Art

According to the trends of decreasing design rules and increasing degree of integration, research on the structures of semiconductor devices that can guarantee both the structural stability and the reliability of signal storage operation have been continued. Studies on ferroelectric memory devices, for use for example in semiconductor devices, that are capable of non-volatile storage of electrical signals and realization of the electrical signals at multiple levels are being conducted.

SUMMARY

A semiconductor device according to an embodiment of the present disclosure includes a substrate, and a gate structure disposed over the substrate. The gate structure includes a hole pattern including a central axis extending in a direction perpendicular to the substrate, and includes a gate electrode layer and an interlayer insulation layer, which are alternately stacked along the central axis. The semiconductor device includes a ferroelectric layer disposed adjacent to a sidewall surface of the gate electrode layer inside the hole pattern, and a channel layer disposed adjacent to the ferroelectric layer inside the hole pattern and extending along the sidewall surface of the gate structure. In this case, one of the gate electrode layer and the interlayer insulation layer protrudes toward the central axis of the hole pattern, relative to the other one of the gate electrode layer and the interlayer insulation layer.

A semiconductor device according to another embodiment of the present disclosure includes a substrate, and a gate structure disposed over the substrate. The gate structure includes a gate electrode pattern layer and an interlayer insulation pattern layer that are alternately stacked along a first direction perpendicular to the substrate, and the gate structure extends in a second direction perpendicular to the first direction. The semiconductor device includes a ferroelectric layer disposed adjacent to a sidewall surface of the gate electrode pattern layer and disposed over the substrate, and a channel layer disposed adjacent to the ferroelectric layer over the substrate and extending along a sidewall surface of the gate structure. One of the gate electrode pattern layer and the interlayer insulation pattern layer protrudes in a third direction perpendicular to the first and second directions, relative to the other one of the gate electrode pattern layer and the interlayer insulation pattern layer.

DETAILED DESCRIPTION

Figure 1:
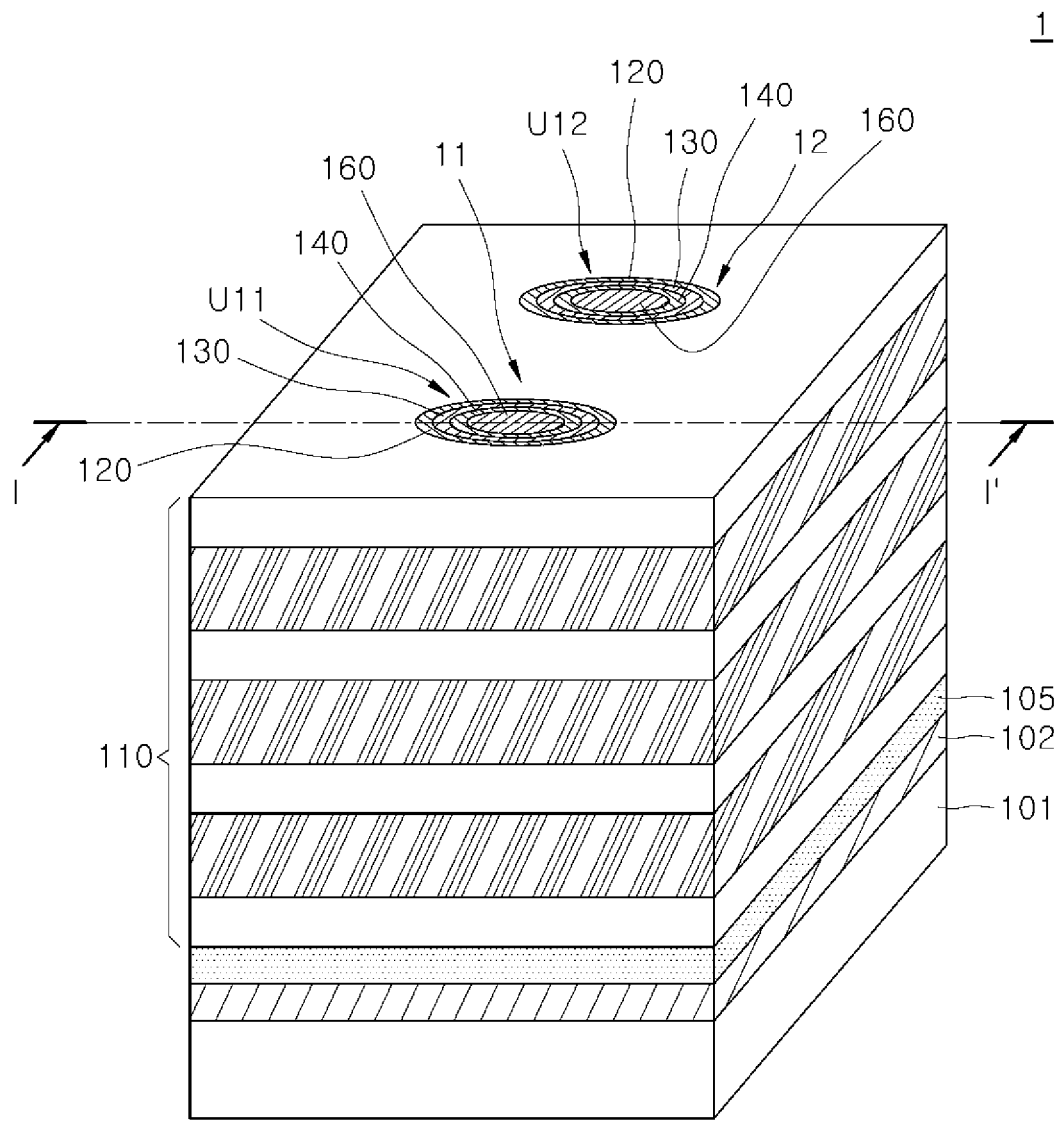
FIG. 1 is a perspective view schematically illustrating a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

In this specification, the term "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the z-axis increases in a positive direction along the x-axis from the origin 0 and a direction in which an absolute value of the z-axis increases in a negative direction along the x-axis from the origin 0. The y-direction and the z-direction may each be interpreted in substantially the same way in the x-y-z coordinate system.

Figure 2:
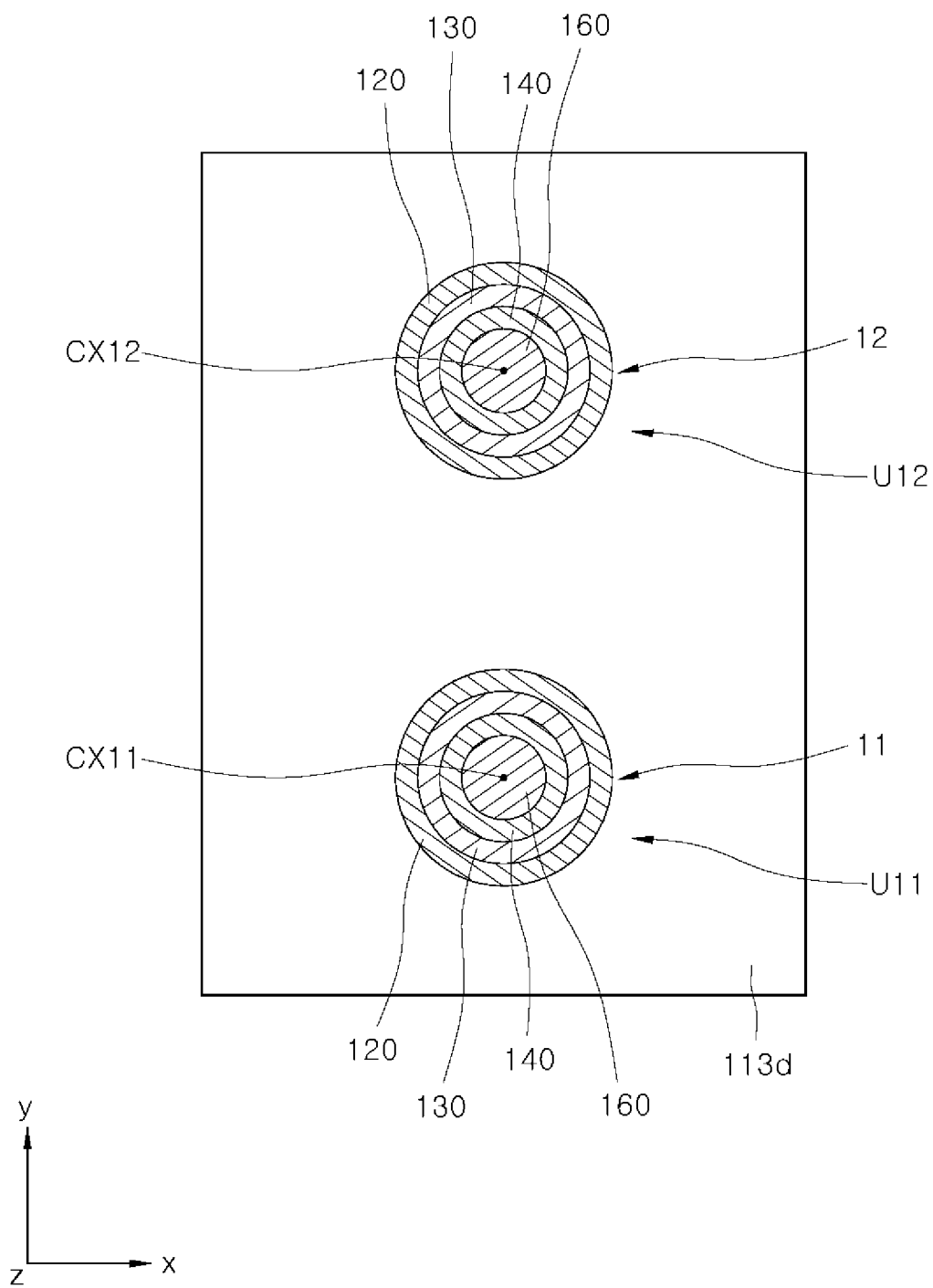
FIG. 2 is a plan view of the semiconductor device of FIG. 1.
Figure 3:
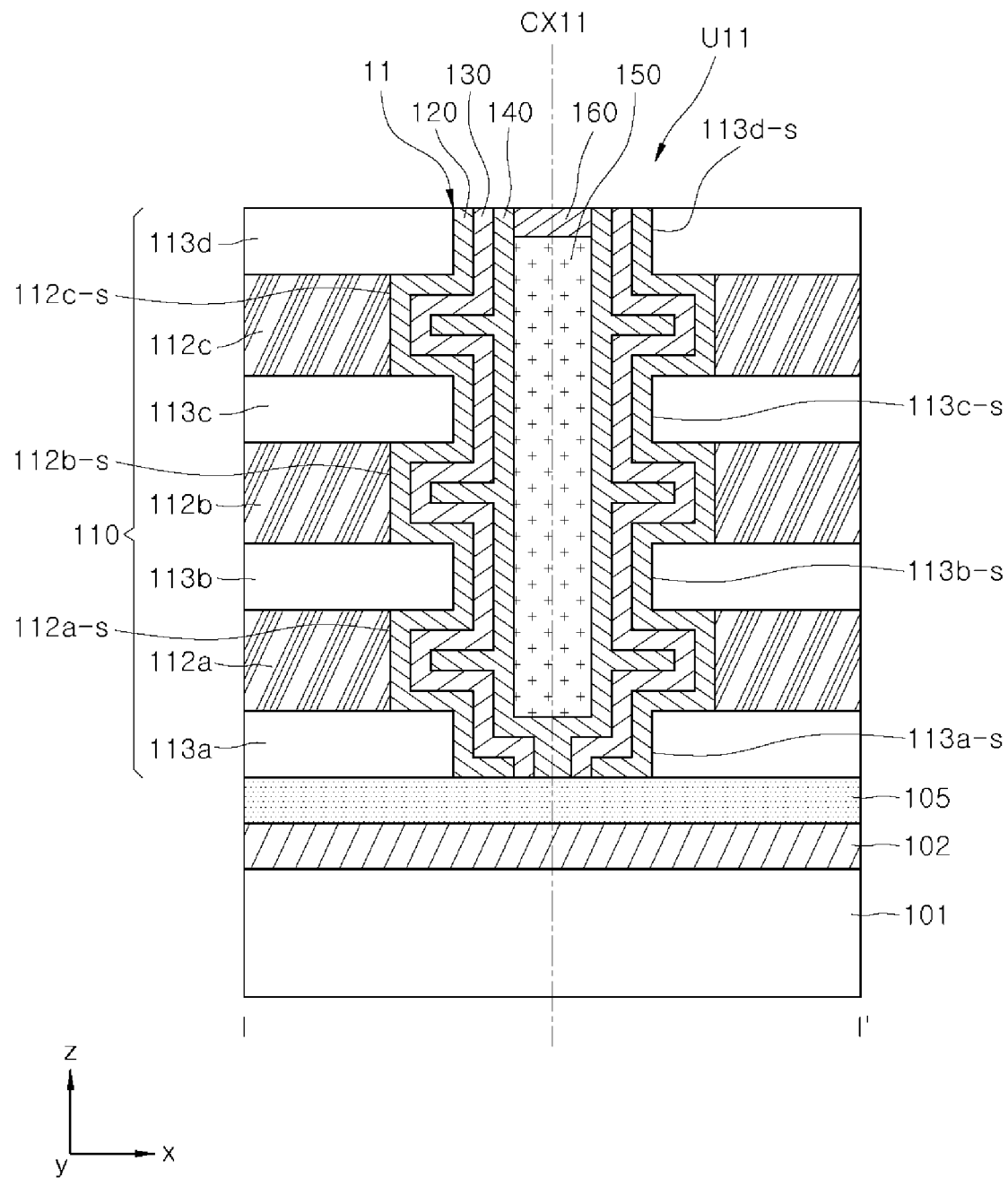
FIG. 3 is a cross-sectional view taken along a line I-I' of the semiconductor device of FIG. 1.

FIG. 1 is a perspective view schematically illustrating a semiconductor device 1 according to an embodiment of the present disclosure. FIG. 2 is a plan view of the semiconductor device of FIG. 1. FIG. 3 is a cross-sectional view taken along a line I-I' of the semiconductor device of FIG. 1.

Referring to FIGS. 1 to 3, the semiconductor device 1 may include a substrate 101, and a gate structure 110 disposed over the substrate 101 and including first and second hole patterns 11 and 12. In addition, the semiconductor device 1 may include a ferroelectric layer 120 disposed along a sidewall surface of the gate structure 110 inside the first and second hole patterns 11 and 12, and a channel layer 140 disposed in contact with the ferroelectric layer 120 inside the hole patterns 11 and 12. The semiconductor device 1 may further include an interfacial insulation layer 130 disposed between the ferroelectric layer 120 and the channel layer 140 inside the first and second hole patterns 11 and 12. In addition, the semiconductor device 1 may include a channel lower contact layer 105 and a channel upper contact layer 160 that are electrically connected to both ends of the channel layer 140, respectively.

Referring to FIGS. 1 to 3, the semiconductor device 1 may include first and second memory element units U11 and U12, which are separated from each other in the first and second hole patterns 11 and 12. When the semiconductor device 1 is operated, the first and second memory element units U11 and U12 may each be operated independently. The first and second memory element units U11 and U12 may share the channel lower contact layer 105 and the gate structure 110 with each other. Each of the first and second memory element units U11 and U12 may include a ferroelectric layer 120, an interfacial insulation layer 130, a channel layer 140, and a channel upper contact layer 160. Although FIGS. 1 and 2 illustrate two hole patterns and two memory element units corresponding to the two hole patterns, the number of hole patterns and the number of memory element units are not necessarily be limited to two. In some embodiments, the hole patterns and the memory element units may be arranged in various numbers.

Referring to FIGS. 1 to 3, the substrate 101 may include a semiconductor material. Specifically, the semiconductor material may include silicon (Si), germanium (Ge), gallium arsenide (GaAs), or the like.

A base insulation layer 102 may be disposed on the substrate 101. The base insulation layer 102 may include an insulating material. The insulating material may include, for example, oxide, nitride, oxynitride, or a combination of two or more thereof.

Although not illustrated in FIG. 1, at least one conductive layer and at least one insulation layer may be disposed between the substrate 101 and the base insulation layer 102. The conductive layer and the insulation layer may form various circuit patterns. That is, the conductive layer and the insulation layer may form an electrical wiring of a multi-layer, or may constitute a passive element such as a capacitor or a resistor, or an active element such as a diode or a transistor. In an embodiment, the circuit pattern may form a driving circuit that controls the operation of memory cells (described below) of the semiconductor device 1.

The channel lower contact layer 105 may be disposed on the base insulation layer 102. The channel lower contact layer 105 may be electrically connected to the channel layer 140. The channel lower contact layer 105 may provide a voltage applied from the source electrode to the channel layer 140. In an embodiment, the source electrode may be disposed over the gate structure 110 and may be electrically connected to the channel lower contact layer 105 through a conductive via (not illustrated) that penetrates the gate structure 110.

The channel lower contact layer 105 may include a conductive material. The conductive material may include, for example, a doped semiconductor material, metal, conductive metal nitride, conductive metal carbide, conductive metal silicide, or conductive metal oxide. The conductive material may include, for example, n-type or p-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The gate structure 110 may be disposed on the channel lower contact layer 105. Referring to FIG. 3, the gate structure 110 may include first to third gate electrode layers 112a, 112b, and 112c, and first to fourth interlayer insulation layers 113a, 113b, 113c, and 113d, which are alternately stacked along the first direction (i.e., the z-direction) perpendicular to an upper or lower surface of the substrate 101. The first interlayer insulation layer 113a may be disposed to contact the channel lower contact layer 105. The fourth interlayer insulation layer 113d may be disposed as an uppermost layer of the gate structure 110. In FIGS. 1 to 3, although the gate structure 110 is illustrated as having three gate electrode layers and four interlayer insulation layers, the gate structure 110 is not limited thereto, and the gate structure 110 may include various numbers of gate electrode layers and various numbers of interlayer insulation layers, which are alternately stacked with the various number of gate electrode layers in the first direction.

Each of the first to third gate electrode layers 112a, 112b, and 112c may include a conductive material. As an example, each of the first to third gate electrode layers 112a, 112b, and 112c may include a doped semiconductor material, metal, conductive metal nitride, conductive metal oxide, conductive metal carbide, or the like. Each of the first to third gate electrode layers 112a, 112b, and 112c may have a crystalline phase. Each of the first to fourth interlayer insulation layers 113a, 113b, 113c, and 113d may include an insulative material. As an example, each of the first to fourth interlayer insulation layers 113a, 113b, 113c, and 113d may include insulative oxide, insulative nitride, insulative oxynitride, or the like. Each of the first to fourth interlayer insulation layers 113a, 113b, 113c, and 113d may have an amorphous phase.

The gate structure 110 may include the first and second hole patterns 11 and 12. The first and second hole patterns 11 and 12 may penetrate the gate structure 110 and expose the channel lower contact layer 105. The first and second hole patterns 11 and 12 may extend along the first direction (the z-direction) in the gate structure 110. The first and second hole patterns 11 and 12 may have, for example, a circular shape on the plan view of FIG. 2, but their cross-sectional shapes are not limited thereto, and cross-sections may have various elliptical shapes or polygonal shapes.

Hereinafter, a cross-sectional structure of the first memory element unit U11 including the first hole pattern 11 will be described with reference to FIG. 3. A cross-sectional structure of the second memory element unit U12, including the second hole pattern 12, is also substantially the same as the cross-sectional structure of the first memory element unit U11.

Referring to FIG. 3, the first to fourth interlayer insulation layers 113a, 113b, 113c, and 113d may protrude or extend, relative to the first to third gate electrode layers 112a, 112b, and 112c, toward a central axis CX11 of the first hole pattern 11. The central axis CX11 of the first hole pattern 11 may be represented as a center point of the circular first hole pattern 11 and the central axis CX12 of the second hole pattern 12 may be represented as a center point of the circular second hole pattern 12 in the plan view of FIG. 2. The central axis CX11 of the first hole pattern 11 may be represented as an axis of symmetry of the first hole pattern 11, extending in a direction perpendicular to the substrate 101 passing the center point of the first hole pattern 11, in the cross-sectional view of FIG. 3.

On the other hand, the first to third gate electrode layers 112a, 112b, and 112c may be recessed, relative to the first to fourth interlayer insulation layers 113a, 113b, 113c, and 113d, in a direction away from the central axis CX11 of the first hole pattern 11. As an example, sidewall surfaces 112a-s, 112b-s, and 112c-s of the first to third gate electrode layers 112a, 112b, and 112c are located in the direction away from the central axis CX11, relative to sidewall surfaces 113a-s, 113b-s, 113c-s, and 113d-s of the first to fourth interlayer insulation layers 113a, 113b, 113c, and 113d. Accordingly, the sidewall surface of the gate structure 110 may have an uneven shape, or a curved shape, along the first direction (z-direction). The ferroelectric layer 120, the interfacial insulation layer 130, and the channel layer 140 may be sequentially disposed on the sidewall surface of the gate structure 110 along the uneven shape or curved shape. Accordingly, the ferroelectric layer 120, the interfacial insulation layer 130, and the channel layer 140 may each include protruding portions that protrude or extend in a radial direction away from the central axis CX11 of the first hole pattern 11. The protruding portions of the ferroelectric layer 120, the interfacial insulation layer 130, and the channel layer 140 may be located in regions in which the first to third gate electrode layers 112a, 112b, and 112c are recessed relative to the first to fourth interlayer insulation layers 113a, 113b, 113c, and 113d.

Referring to FIG. 3, the ferroelectric layer 120 may be disposed to cover the sidewall surface of the gate structure 110. The ferroelectric layer 120 may include a crystalline ferroelectric material. The ferroelectric layer 120 may include a plurality of crystal grains. Each of the plurality of crystal grains may have a polarization axis therein, and may have spontaneous unit polarization arranged in any one of a pair of directions parallel to the polarization axis. The pair of directions, that is, the first orientation and the second orientation, may be opposite to each other.

The ferroelectric layer 120 may have remanent polarization corresponding to the sum of the unit polarization of the ferroelectric material in each crystal grain in the absence of an applied external electric field. As an example, when all of the unit polarization of the plurality of crystal grains is arranged in the first orientation, the ferroelectric layer 120 may have a first remanent polarization that is a maximum polarization value. As another example, when all of the unit polarization of the plurality of crystal grains is arranged in the second orientation, the ferroelectric layer 120 may have a second remanent polarization that is a maximum polarization value. That is, the first and second remanent polarization having opposite orientations may have substantially the same polarization value. As another example, when the unit polarization of a plurality of crystal grains is divided and distributed into polarization with the first orientation and the second orientation, the orientation of the remanent polarization of the ferroelectric layer 120 may be determined by the fraction of the crystal grains having the first orientation and the fraction of the crystal grains having the second orientation. That is, when the fraction of the crystal grains having the first orientation is larger than the fraction of the crystal grains having the second orientation, the ferroelectric layer 120 as a whole may have remanent polarization of the first orientation. In this example, the remanent polarization value of the ferroelectric layer 120 may be smaller than the maximum remanent polarization value.

When an external electric field is applied to the ferroelectric layer 120, polarization orientation of the ferroelectric material of the ferroelectric layer 120 may be switched along a predetermined polarization hysteresis curve. Under the applied electric field, switching of the polarization orientation of the ferroelectric layer 120 may be performed for each crystal grain inside the ferroelectric layer 120. Switching of the polarization orientation of the ferroelectric layer 120 may occur when an external electric field having a magnitude equal to or greater than a coercive electric field of the ferroelectric material is applied for each grain. As a whole, switching of the polarization orientation of the ferroelectric layer 120 may be a result of switching of the unit polarization in each of the plurality of grains.

According to an embodiment, depending on the magnitude of the external electric field applied to the ferroelectric layer 120, the fraction of the crystal grains, from among the plurality of crystal grains, in which the unit polarization is switched may vary. As an example, when an external electric field having a magnitude equal to or greater than a predetermined saturation electric field is applied to the ferroelectric layer 120, all of the unit polarization in the plurality of grains may be switched to have the same direction or orientation along the external electric field. Conversely, when an external electric field having a magnitude less than a predetermined saturation electric field is applied to the ferroelectric layer 120, switching of the unit polarization may occur only in a part of the grains from among the plurality of grains.

After the external electric field is removed, the ferroelectric layer 120 may maintain predetermined remanent polarization corresponding to the sum of the unit polarization formed in the plurality of crystal grains. Accordingly, by controlling the magnitude of the external electric field applied to the ferroelectric layer 120, a plurality of pieces of different remanent polarization having a polarization value between 0 and the maximum polarization value can be implemented in the ferroelectric layer 120.

In an embodiment of the present disclosure, the ferroelectric layer 120 is disposed along the uneven shape or curved shape of the gate structure 110, so that the area of the ferroelectric layer 120 can be increased by an area corresponding to the protruding portions. Due to the increased area of the ferroelectric layer 120, the number of the crystal grains distributed in the ferroelectric layer 120 may increase when forming the ferroelectric layer 120 under the same chemical process conditions. Meanwhile, because the unit polarization can be switched for each crystal grain within the ferroelectric layer 120, as the number of crystal grains increases, the number of states of the remanent polarization implemented by the ferroelectric layer 120 can also increase. As an example, when an external electric field is applied to the ferroelectric layer 120 within a predetermined electric field range, the number of states of the remanent polarization of the ferroelectric layer 120, which is implemented in correspondence to the fraction of grains in which the unit polarization is switched and the fraction of grains in which the unit polarization is not switched, can be increased. As a result, the number of different pieces of signal information implemented corresponding to the number of states of the remanent polarization can be increased, thereby improving the memory storage performance of the semiconductor device 1. As an example, in proportion to the piece of the signal information stored in the semiconductor device 1, memory window performance can be improved.

The ferroelectric material may include, for example, hafnium oxide, zirconium oxide, hafnium zirconium oxide, or a combination of two or more thereof. At this time, the ferroelectric material may have an orthorhombic crystal structure. As another example, the ferroelectric material may include a material having a perovskite crystal structure, such as barium titanium oxide ($BaTiO_3$).

Referring to FIGS. 1 to 3 again, the interfacial insulation layer 130 may be disposed on the ferroelectric layer 120. The interfacial insulation layer 130 may include an insulative material. The insulative material may include, for example, silicon oxide, silicon nitride, silicon oxynitride, aluminum oxide, hafnium oxide, or the like. The interfacial insulation layer 130 may have an amorphous phase.

The interfacial insulation layer 130 may serve to suppress material diffusion between the ferroelectric layer 120 and the channel layer 140. In addition, the interfacial insulation layer 130 may be disposed between the crystalline ferroelectric layer 120 and channel layer 140 to function as a buffer layer to mitigate the difference in lattice constant between the ferroelectric layer 120 and the channel layer 140. In some embodiments, the interfacial insulation layer 130 may be omitted. In such cases, the channel layer 140 may be directly disposed on the ferroelectric layer 120.

Referring again to FIGS. 1 to 3, the channel layer 140 may be disposed on the interfacial insulation layer 130. The channel layer 140 may extend along the sidewall surface of the gate structure 110 to be electrically connected to the channel lower contact layer 105 and the channel upper contact layer 160.

The channel layer 140 may include a semiconductor material. The semiconductor material may include, for example, silicon (Si), germanium (Ge), gallium arsenide (GaAs), or the like. The semiconductor material may include, for example, a two-dimensional semiconductor material. The two-dimensional semiconductor material may include transition metal dichalcogenide (TMDC), black phosphorus, or the like. The transition metal chalcogenide may include, for example, molybdenum selenide (MoSe2), hafnium selenide (HfSe2), indium selenide (InSe), gallium selenide (GaSe), and the like. The semiconductor material may include, for example, a metal oxide such as indium-gallium-zinc oxide (IGZO).

Referring to FIG. 3, a core insulation structure 150 may be disposed inside the first hole pattern 11 in which the ferroelectric layer 120, the interfacial insulation layer 130, and the channel layer 140 are disposed. The core insulation structure 150 may fill the first hole pattern 11 and structurally stabilize the ferroelectric layer 120, the interfacial insulation layer 130, and the channel layer 140.

Inside the first hole pattern 11, the channel upper contact layer 160 may be disposed on the core insulation structure 150. The channel upper contact layer 160 may be electrically connected to the channel layer 140. Although not illustrated, the channel upper contact layer 160 may be electrically connected to a drain electrode (not illustrated). The drain electrode may be disposed on the top or side of the gate structure 110.

The channel upper contact layer 160 may include a conductive material. The conductive material may include, for example, a doped semiconductor material, metal, conductive metal nitride, conductive metal carbide, conductive metal silicide, or conductive metal oxide. The conductive material may include, for example, silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

In FIG. 3, the channel upper contact layer 160 is disposed inside the first hole pattern 11, but its location is not limited thereto. In other embodiments, the channel upper contact layer 160 may be disposed outside the first hole pattern 11. As an example, the channel upper contact layer 160 may be disposed on the channel layer 140 to be electrically connected to the channel layer 140.

As described above, the semiconductor device 1 according to an embodiment of the present disclosure may include the gate structure 110 having a sidewall surface of an uneven shape or a curved shape. The ferroelectric layer 120, the interfacial insulation layer 130, and the channel layer 140 may be disposed along the sidewall surface of the gate structure 110, so that the ferroelectric layer 120, the interfacial insulation layer 130, and the channel layer 140 may have protruding portions corresponding to the uneven shape or curved shape. As a result, the ferroelectric layer 120 may have an increased area corresponding to the projecting portions. Accordingly, when the ferroelectric layer 120 is formed under the same process conditions, the number of crystal grains distributed in the ferroelectric material of the ferroelectric layer 120 may be increased by the increased area. Based on the increased number of crystal grains, the number of remanent polarization states that can be controlled in the ferroelectric layer 120 can be increased. Through this, the number of pieces of the signal information stored in the ferroelectric layer 120 may be increased to increase a memory window that expands memory performance of the semiconductor device 1.

Figure 4:
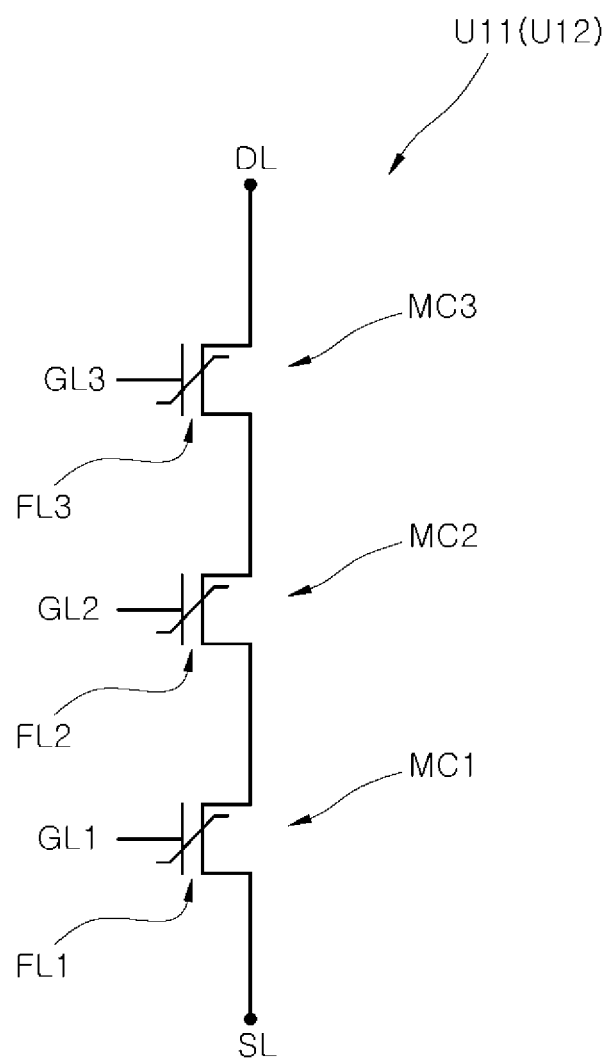
FIG. 4 is a circuit diagram of a semiconductor device according to an embodiment of the present disclosure.

FIG. 4 is a circuit diagram of a semiconductor device according to an embodiment of the present disclosure. More specifically, FIG. 4 may be a circuit diagram of any one of the first and second memory element units U11 and U12 described above with reference to FIGS. 1 to 3. Hereinafter, a method of operating the semiconductor device 1 will be described using the first memory element unit U11 for convenience. The operating method of the first memory element unit U11 may be applied to the second memory element unit U12 in substantially the same manner.

Referring to FIG. 4, the first memory element unit U11 may include first to third memory cells MC1, MC2, and MC3 in the form of transistors. The first to third memory cells MC1, MC2, and MC3 may be connected in series with each other in a string form between a source electrode SL and a drain electrode DL. The first to third memory cells MC1, MC2, and MC3 are non-volatile memory elements, and may include first to third ferroelectric elements FL1, FL2, and FL3 corresponding to gate dielectric layers of the transistors.

Referring to FIGS. 1 to 3 again, the channel lower contact layer 105 and the channel upper contact layer 160 may be electrically connected to the source electrode (not illustrated) and the drain electrode layer (not illustrated), respectively. The source electrode and the drain electrode may correspond to the source electrode SL and the drain electrode DL of FIG. 4, respectively. The first to third gate electrode layers 112a, 112b, and 112c may correspond to the first to third gate electrodes GL1, GL2, and GL3 of FIG. 4. The memory regions in the ferroelectric layer 120 controlled by the first to third gate electrode layers 112a, 112b, and 112c of FIGS. 1 to 3 may correspond to the first to third ferroelectric elements FL1, FL2, and FL3 of FIG. 4, respectively.

A write operation and a read operation for the first to third memory cells MC1, MC2, and MC3 will be described with reference to FIGS. 1 to 4 together. As an example, the write operation and the read operation for the second memory cell MC2 will be described, but the write operation and the read operation for the first and third memory cells MC1 and MC3 may also be performed in substantially the same way.

Referring to FIGS. 3 and 4, first, a write operation for the second memory cell MC2 will be described. Referring to FIG. 4, in a state in which a ground potential is applied to the source electrode SL and the drain electrode DL, a predetermined write voltage of a positive polarity or a negative polarity may be applied to the second ferroelectric element FL2 through the second gate electrode GL2. The write voltage is then removed. The write voltage may not be applied to the first and third gate electrode GL1 and GL3. Alternatively, a voltage having a magnitude that does not switch the polarization orientation of the first and third ferroelectric elements FL1 and FL3 may be applied to the first and third gate electrode GL1 and GL3. Remanent polarization having one of the first orientation and the second orientation may be written in the second ferroelectric element FL2 by the write voltage.

Referring to FIG. 3, the channel lower contact layer 105 and the channel upper contact layer 160 may each maintain a ground potential. Subsequently, a write voltage having a positive polarity or a negative polarity may be applied to the second gate electrode layer 112b and then removed. The write voltage may not be applied to the first and third gate electrode layers 112a and 112c, or alternatively, a voltage having a magnitude that does not switch the polarization orientation of the ferroelectric layer 120 may be applied to the first and third gate electrode layers 112a and 112c. As a result, remanent polarization of the first orientation or the second orientation may be written in the region of the ferroelectric layer 120 controlled by the second gate electrode layer 112b.

Next, a read operation will be described with reference to FIGS. 3 and 4. Referring to FIG. 4, a gate turn-on voltage may be respectively applied through the first and third gate electrodes GL1 and GL3. The gate turn-on voltage may form a conductive channel in the channel regions of the transistors of the first to third memory cells MC1, MC2, and MC3. Meanwhile, a read voltage may be applied through the second gate electrode GL2. The read voltage may be a voltage having a magnitude that does not switch the polarization orientation of the second ferroelectric element FL2. When the read voltage is applied, the formation of a conductive channel in the channel region of the transistor of the second memory cell MC2 depends on the orientation and magnitude of the polarization of the second ferroelectric element FL2. As an example, when the polarization orientation of the second ferroelectric element FL2 is the first polarization orientation toward the channel layer from the second gate electrode GL2, and the polarization of the second ferroelectric element FL2 has a magnitude greater than or equal to a predetermined threshold value, a conductive channel can be formed in the channel region of the transistor of the second memory cell MC2 by the read voltage. Conversely, when the polarization orientation of the second ferroelectric element FL2 is the second polarization orientation toward the second gate electrode GL2 from the channel layer, or when the polarization of the second ferroelectric element FL2 has a magnitude less than a predetermined threshold value, a conductive channel might not be formed in the channel region of the transistor of the second memory cell MC2 by the read voltage.

Subsequently, a source-drain operation voltage may be applied between the source electrode SL and the drain electrode DL. When a conductive channel is formed in the channel region of the transistor of the second memory cell MC2, a channel current can flow between the source electrode SL and the drain electrode DL. Conversely, when a conductive channel is not formed in the channel region of the transistor of the second memory cell MC2, a channel current might not flow between the source electrode SL and the drain electrode DL. The semiconductor device 1 may read the presence or absence of a channel current flowing between the source electrode SL and the drain electrode DL to read information stored in the second memory cell MC2.

Correspondingly, referring to the structure of FIG. 3, a gate turn-on voltage may be applied to the first and third gate electrode layers 112a and 112c. The gate turn-on voltage may form a conductive channel in the regions of the channel layer 140 controlled by the first and third gate electrode layers 112a and 112c. Meanwhile, a read voltage may be applied through the second gate electrode layer 112b. The read voltage might not switch the polarization orientation of the ferroelectric layer 120. In addition, when the read voltage is applied, whether or not a conductive channel is formed in the region of the channel layer 140 controlled by the second gate electrode layer 112b depends on the orientation and magnitude of the polarization stored in the region of the ferroelectric layer 120 controlled by the second gate electrode layer 112b.

Subsequently, a source-drain operation voltage may be applied between the channel lower contact layer 105 and the channel upper contact layer 160. It is possible to read out the information stored in the region of the ferroelectric layer 120 controlled by the second gate electrode layer 112b by determining whether or not a channel current flows between the channel lower contact layer 105 and the channel upper contact layer 160.

Figure 5:
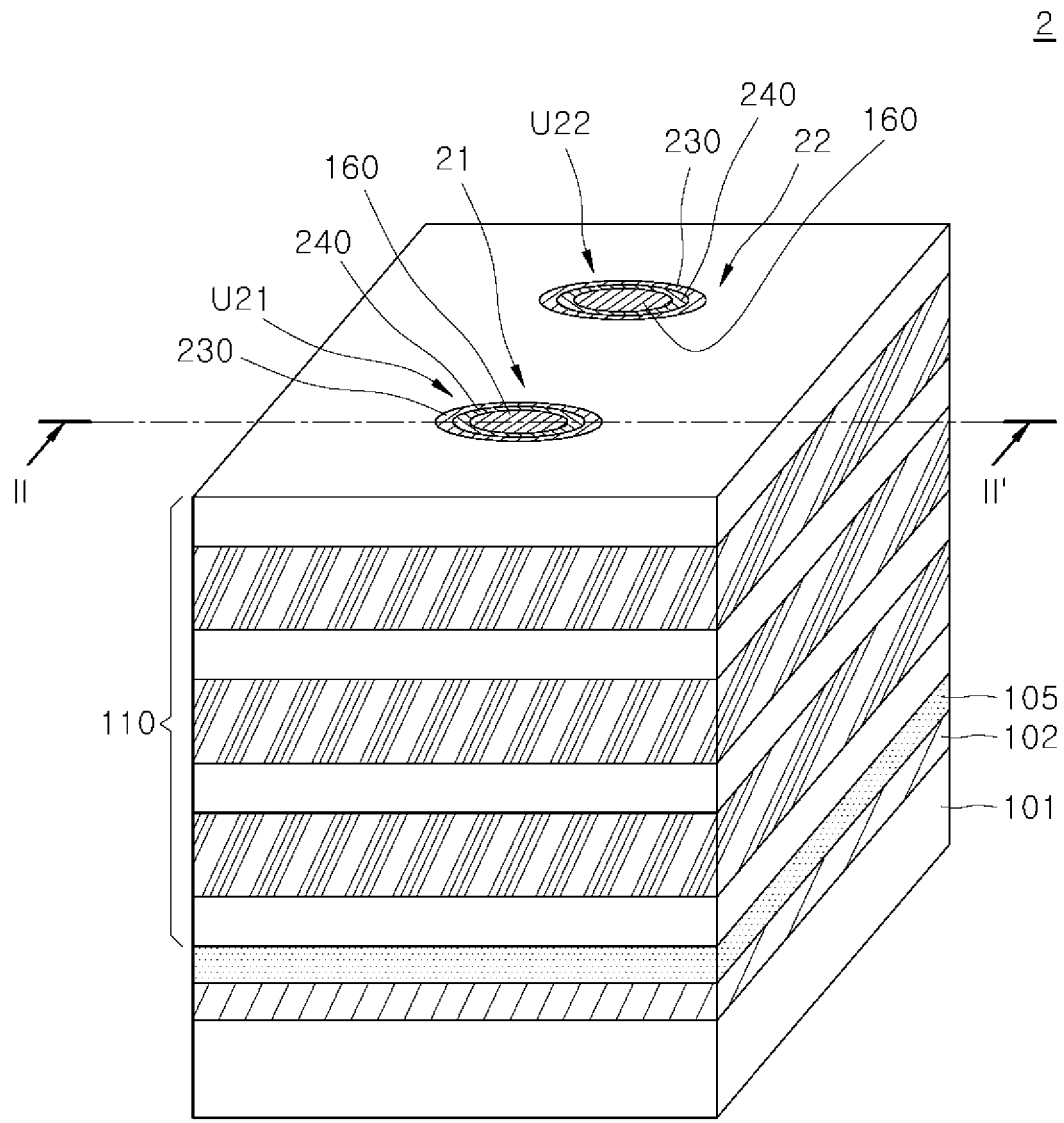
FIG. 5 is a perspective view schematically illustrating a semiconductor device according to another embodiment of the present disclosure.
Figure 6:
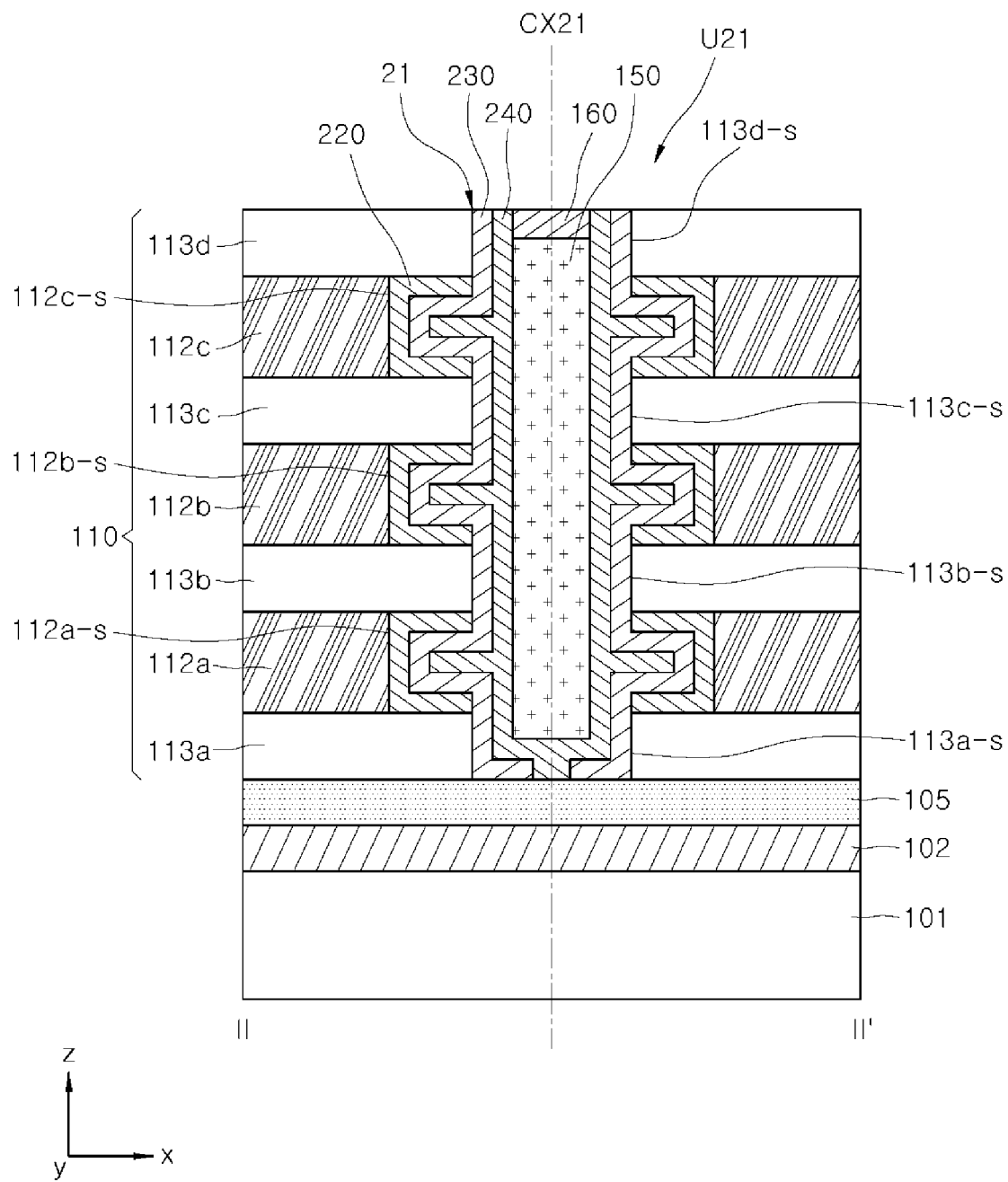
FIG. 6 is a cross-sectional view taken along a line II-II' of the semiconductor device of FIG. 5.

FIG. 5 is a perspective view schematically illustrating a semiconductor device 2 according to another embodiment of the present disclosure. FIG. 6 is a cross-sectional view taken along a line II-II' of the semiconductor device of FIG. 5.

Referring to FIGS. 5 and 6, an arrangement of a ferroelectric layer 220 of the semiconductor device 2 may be different from the arrangement of the ferroelectric layer 120 of the semiconductor device 1 described with reference to FIGS. 1 to 3. Other configurations of the semiconductor device 2 except for the arrangement of the ferroelectric layer 220 and an interfacial insulation layer 230 may be substantially the same as those of the semiconductor device 1.

The semiconductor device 2 may include a gate structure 110 including first and second hole patterns 21 and 22 on a channel lower contact layer 105. The semiconductor device 2 may include first and second memory element units U21 and U22 corresponding to the first and second hole patterns 21 and 22, respectively. The first and second memory element units U21 and U22 may be substantially the same in configuration.

The semiconductor device 2 may include the ferroelectric layer 220 in contact with the sidewall surfaces 112a-s, 112b-s, and 112c-s of first to third gate electrode layers 112a, 112b, and 112c, respectively, inside the first and second hole patterns 21 and 22. In this embodiment, the ferroelectric layer 220 might not be disposed on the sidewall surfaces 113a-s, 113b-s, 113c-s, and 113d-s of the first to fourth interlayer insulation layers 113a, 113b, 113c, and 113d, respectively. The ferroelectric layer 220 may include protruding portions protruding in a radial direction away from the central axes CX21 and CX22 of the first and second hole patterns 21 and 22, respectively. The properties of the ferroelectric layer 220 may be the same as those of the ferroelectric layer 120 of the embodiment of FIGS. 1 to 3.

Referring to FIG. 6, the interfacial insulation layer 230 may be disposed on channel lower contact layer 105 and may be disposed to contact the ferroelectric layer 220. In addition, the interfacial insulation layer 230 may contact the sidewall surfaces 113a-s, 113b-s, 113c-s, and 113d-s of the first to fourth interlayer insulation layers 113a, 113b, 113c, and 113d. The properties of the interfacial insulation layer 230 may be the same as those of the interfacial insulation layer 130 of the embodiment of FIGS. 1 to 3. A channel layer 240 may be disposed on the interfacial insulation layer 230. The properties of the channel layer 240 may be the same as those of the channel layer 140 of the embodiment of FIGS. 1 to 3.

In this embodiment, the first to third gate electrode layers 112a, 112b, and 112c may contact the ferroelectric layer 220 in a direction parallel to a surface of the substrate 101, and the first to fourth interlayer insulating layers 113a, 113b, 113c, and 113d may contact the interfacial insulation layer 230 in a direction parallel to the surface of the substrate 101. The channel layer 240 may be disposed to cover the interfacial insulation layer 230.

In some embodiments, the interfacial insulation layer 230 may be omitted. In these cases, the first to third gate electrode layers 112a, 112b, and 112c may contact the ferroelectric layer 220 in a direction parallel to the surface of the substrate 101, and the first to fourth interlayer insulation layers 113a, 113b, 113c, and 113d may contact the channel layer 240 in a direction parallel to the surface of the substrate 101. In addition, the ferroelectric layer 220 may be disposed to contact the channel layer 240.

As illustrated in FIG. 3, when the ferroelectric layer 120 is disposed on the sidewall surfaces 113a-s, 113b-s, 113c-s, and 113d-s of the first to fourth interlayer insulation layers 113a, 113b, 113c, and 113d, the regions of the ferroelectric layer 120 disposed on the sidewall surfaces 113a-s, 113b-s, 113c-s, and 113d-s may be affected by a voltage applied to a pair of gate electrode layers adjacent to each other in a direction perpendicular to the surface of the substrate 101. In some cases, due to the influence of the voltage applied to the adjacent pair of gate electrode layers, undesired remanent polarization may be formed in the portions of the ferroelectric layer 120 disposed on the sidewall surfaces 113a-s, 113b-s, 113c-s, and 113d-s. The undesired remanent polarization may change the orientation and magnitude of the polarization stored in the region of the ferroelectric layer 120 corresponding to the memory cell during the writing operations of the first and second memory element units U11 and U12. Accordingly, errors in the recording operations may be generated. Further, the undesired remanent polarization may cause errors in the read operations by changing the channel current during the read operations of the first and second memory element units U11 and U12. Referring to FIGS. 5 and 6, the ferroelectric layer 220 might not be disposed on the sidewall surfaces 113a-s, 113b-s, 113c-s, and 113d-s of the first to fourth interlayer insulation layers 113a, 113b, 113c, and 113d. In this embodiment, errors in write operations and read operations that result from the influence of the voltage applied to the adjacent pair of gate electrode layers and undesired remanent polarization can be prevented.

Figure 7:
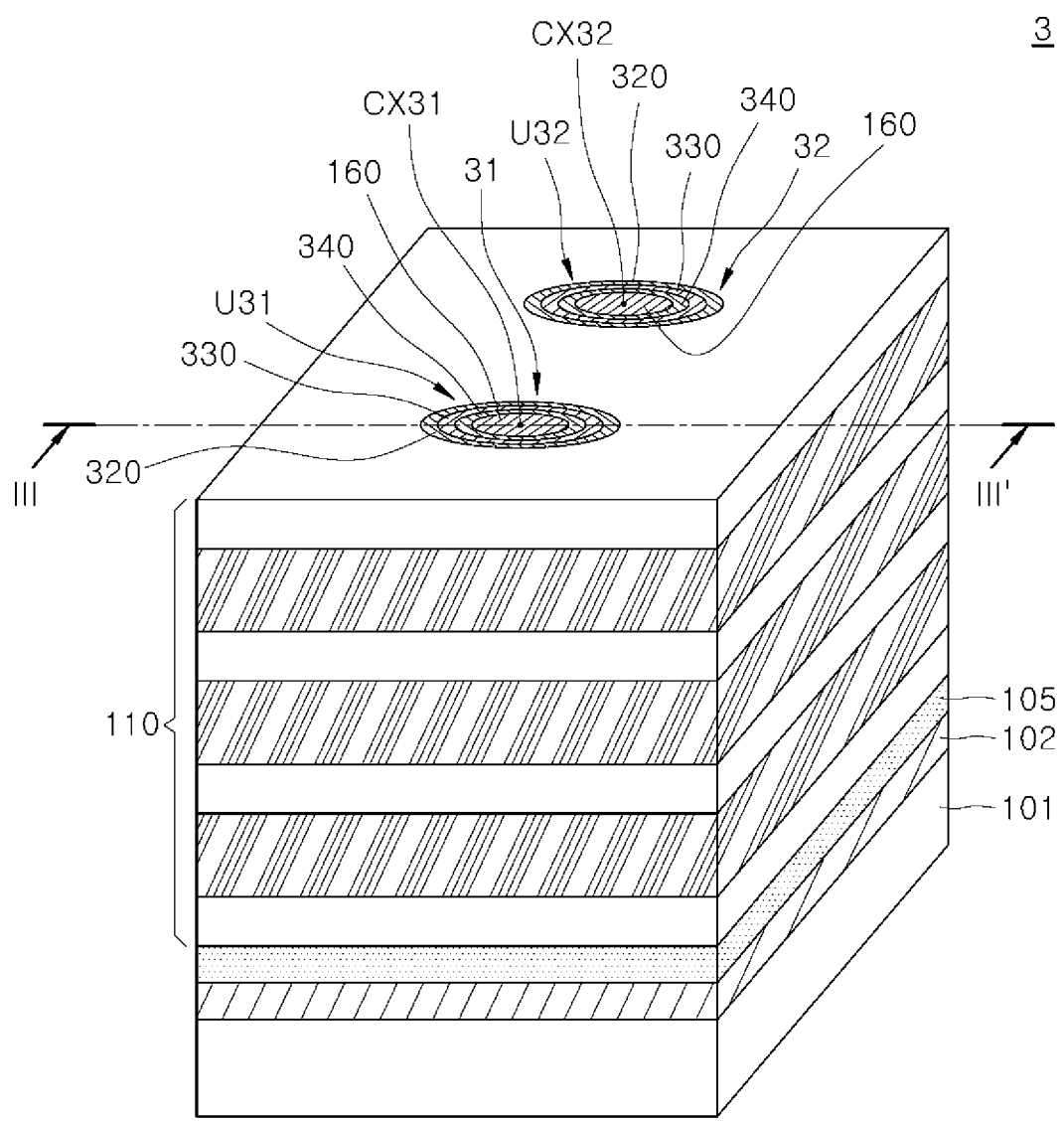
FIG. 7 is a perspective view schematically illustrating a semiconductor device according to another embodiment of the present disclosure.
Figure 8:
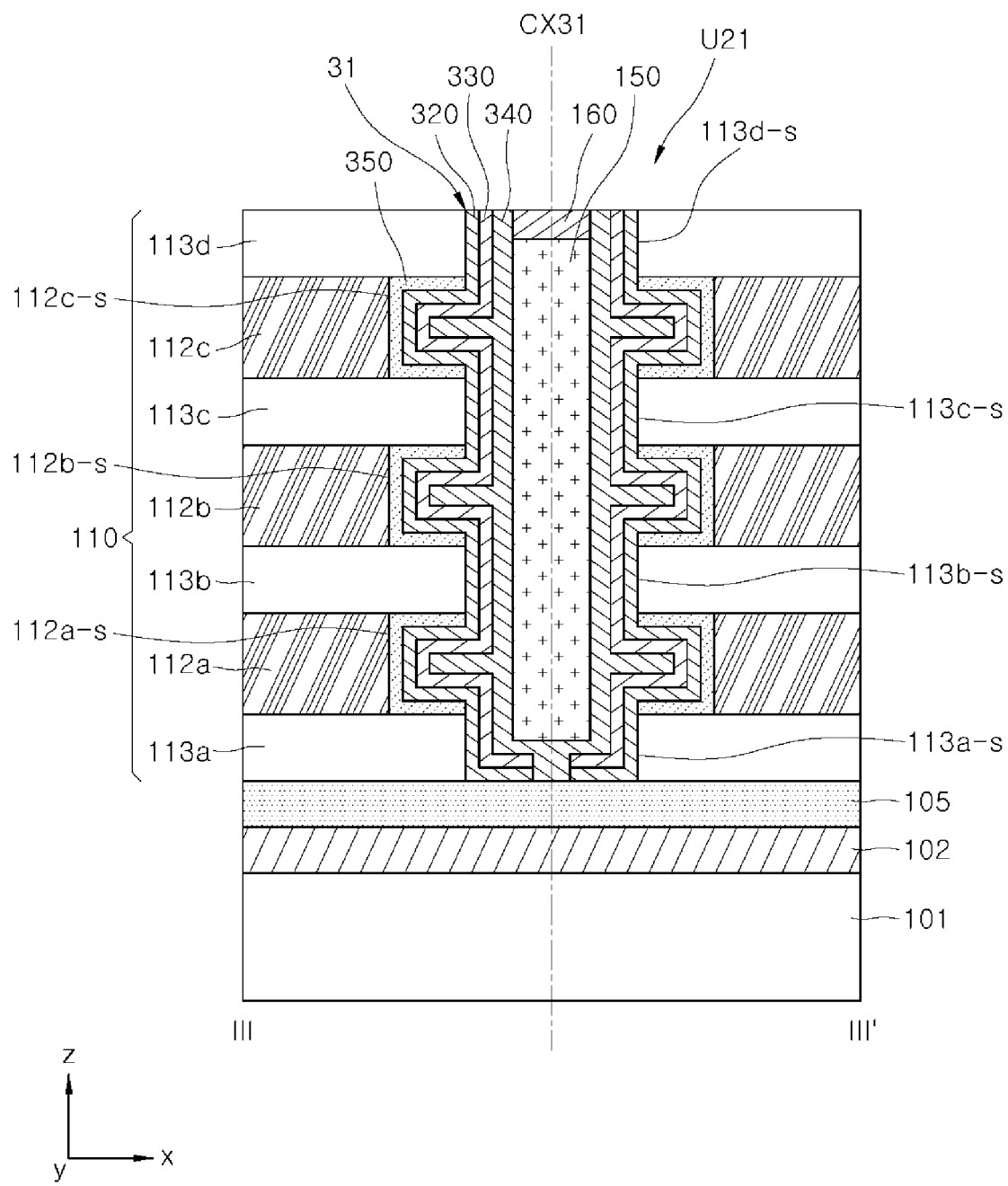
FIG. 8 is a cross-sectional view taken along a line III-III' of the semiconductor device of FIG. 7.

FIG. 7 is a perspective view schematically illustrating a semiconductor device 3 according to another embodiment of the present disclosure. FIG. 8 is a cross-sectional view taken along a line III-III' of the semiconductor device of FIG. 7.

Referring to FIGS. 7 and 8, the semiconductor device 3 may further include a ferroelectric induction layer 350, compared to the semiconductor device 1 described with reference to FIGS. 1 to 3. Other configurations of the semiconductor device 3, except for the ferroelectric induction layer 350, may be substantially the same as those of the semiconductor device 1. As an example, the configurations of the ferroelectric layer 320, the interfacial insulation layer 330, and the channel layer 340 of the semiconductor device 3 may be substantially the same as those of the ferroelectric layer 120, the interfacial insulation layer 130, and the channel layer 140 of the semiconductor device 1.

The semiconductor device 3 may include a gate structure 110 including first and second hole patterns 31 and 32 on a channel lower contact layer 105. The semiconductor device 3 may include first and second memory element units U31 and U32 corresponding to the first and second hole patterns 31 and 32. The first and second memory element units U31 and U32 may have substantially the same configuration.

The semiconductor device 3 may include the ferroelectric induction layer 350 disposed between the sidewall surfaces 112a-s, 112b-s, and 112c-s of the first to third gate electrode layers 112a, 112b, and 112c and the ferroelectric layer 320 inside the first and second hole patterns 31 and 32. The ferroelectric induction layer 350 may be disposed to contact the sidewall surfaces 112a-s, 112b-s, and 112c-s of the first to third gate electrode layers 112a, 112b, and 112c, and may also be disposed to contact a pair of neighboring interlayer insulation layers among the first to fourth interlayer insulation layers 113a, 113b, 113c, and 113d in a direction perpendicular to the surface of the substrate 101. Thus, the ferroelectric induction layer 350 may be disposed to contact protruding portions of the ferroelectric layer 320, which protrude in a radial direction toward the sidewall surfaces 112a-s, 112b-s, and 112c-s of the first to third gate electrode layers 112a, 112b, and 112c.

The ferroelectric induction layer 350 may help a portion of the ferroelectric layer 320 in contact the ferroelectric induction layer 350 to stably maintain ferroelectricity. The ferroelectric induction layer 350 may include a crystalline conductive material. The ferroelectric induction layer 350 may include, for example, metal or conductive metal nitride. As an example, the ferroelectric induction layer 350 may include tungsten (W), platinum (Pt), palladium (Pd), aluminum (Al), gold (Au), molybdenum (Mo), tantalum nitride (TaN), titanium nitride (TiN), or a combination of two or more thereof.

The ferroelectric induction layer 350 may have a different lattice constant from the ferroelectric layer 320. Due to the difference in the lattice constant, lattice strain may occur in the ferroelectric layer 320 in contact with the ferroelectric induction layer 350. The lattice strain may form a lattice strain gradient from the interface between the ferroelectric induction layer 350 and the ferroelectric layer 320 into the ferroelectric layer 320. The lattice strain gradient may generate a flexoelectric effect, thereby forming an electric field inside the ferroelectric layer 320. The electric field may control the polarization orientation inside the ferroelectric layer 320 so that the polarization is more uniformly distributed, and so that the ferroelectric layer 320 can stably retain ferroelectric properties.

According to an embodiment, in the forming step of the ferroelectric layer 320, the crystalline ferroelectric induction layer 350 is first formed inside the first and second hole patterns 31 and 32 of the gate structure 110. Subsequently, an amorphous ferroelectric material layer having no ferroelectricity may be formed to contact the ferroelectric induction layer 350 and the interlayer insulating layers 113a, 113b, 113c, and 113d. Subsequently, the ferroelectric material layer may be heat treated to be converted into the crystalline ferroelectric layer 320. At this time, a portion of the ferroelectric material layer contacting the ferroelectric induction layer 350 may be more effectively converted into the ferroelectric layer 320 having ferroelectric properties through the flexoelectric effect. On the other hand, a portion of the ferroelectric material layer in contact with the interlayer insulation layers 113a, 113b, 113c, and 113d may have relatively poor ferroelectric properties after the crystallization.

Meanwhile, in this embodiment, the ferroelectric induction layer 350 having conductivity may be disposed to surround the protruding portions of the ferroelectric layer 320 described above in a 'c' shape toward the central axes CX31 and CX32 of the first and second hole patterns 31 and 32. The ferroelectric induction layer 350 may serve to apply the voltage received from the gate electrode layers 112a, 112b, and 112c to the ferroelectric layer 320.

In some embodiments, in the semiconductor device 1 described above with reference to FIGS. 1 to 3 and in the semiconductor device 2 described above with reference to FIGS. 5 and 6, each of the gate electrode layers 112a, 112b, and 112c may additionally include extensions disposed in a 'c' shape toward the central axes CX11, CX12, CX21, and CX22 of the first and second hole patterns 11, 12, 21, and 22 to surround the protruding portions of the ferroelectric layers 120 and 220, respectively. Each of the extension portions of the gate electrode layers 112a, 112b, and 112c, for example, may have substantially the same shape as that of the ferroelectric induction layer 350 of this embodiment.

In some embodiments, the interfacial insulation layer 330 may be omitted. In this case, the ferroelectric layer 320 may be disposed to contact the channel layer 340.

Figure 9:
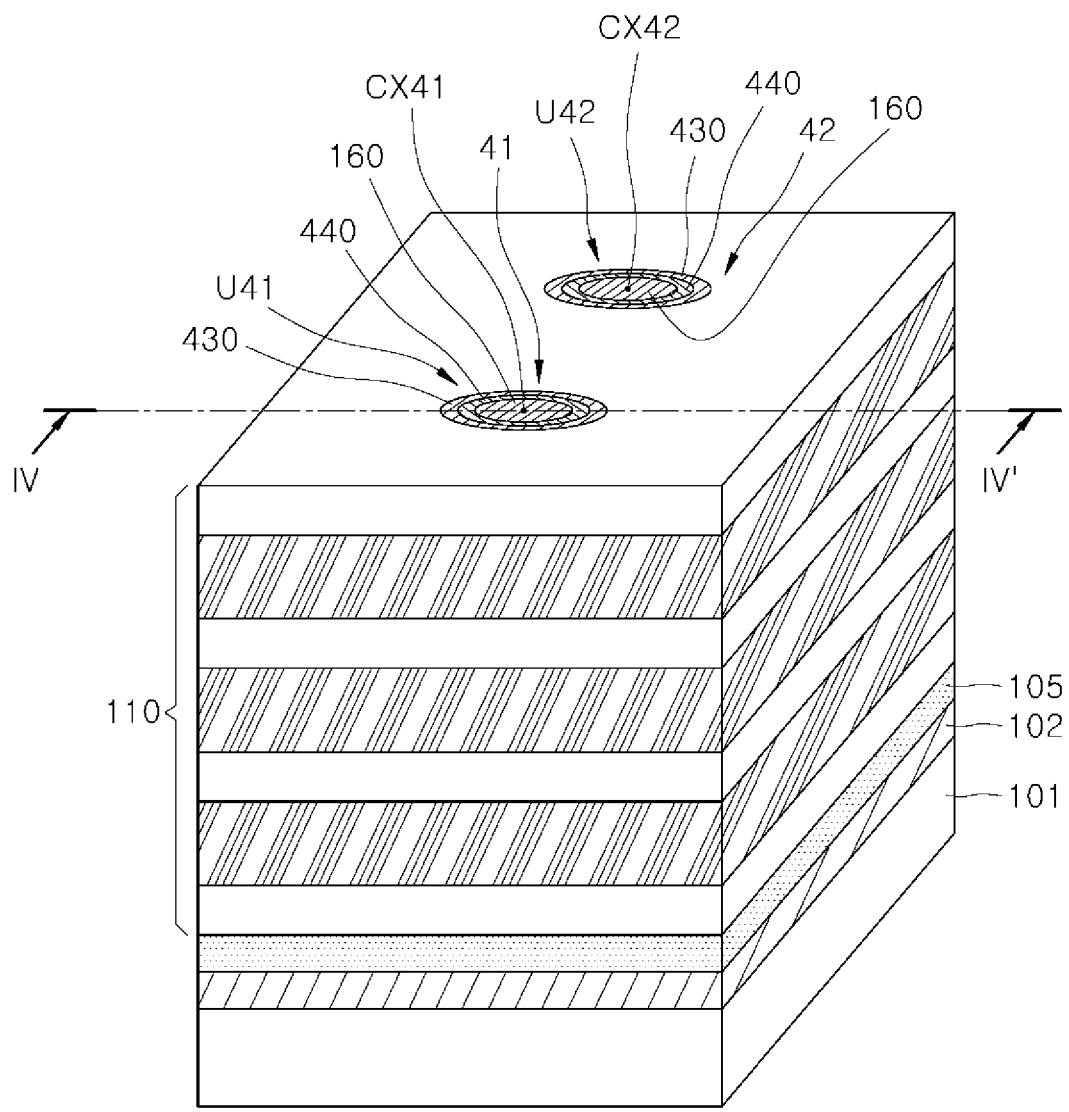
FIG. 9 is a perspective view schematically illustrating a semiconductor device according to another embodiment of the present disclosure.
Figure 10:
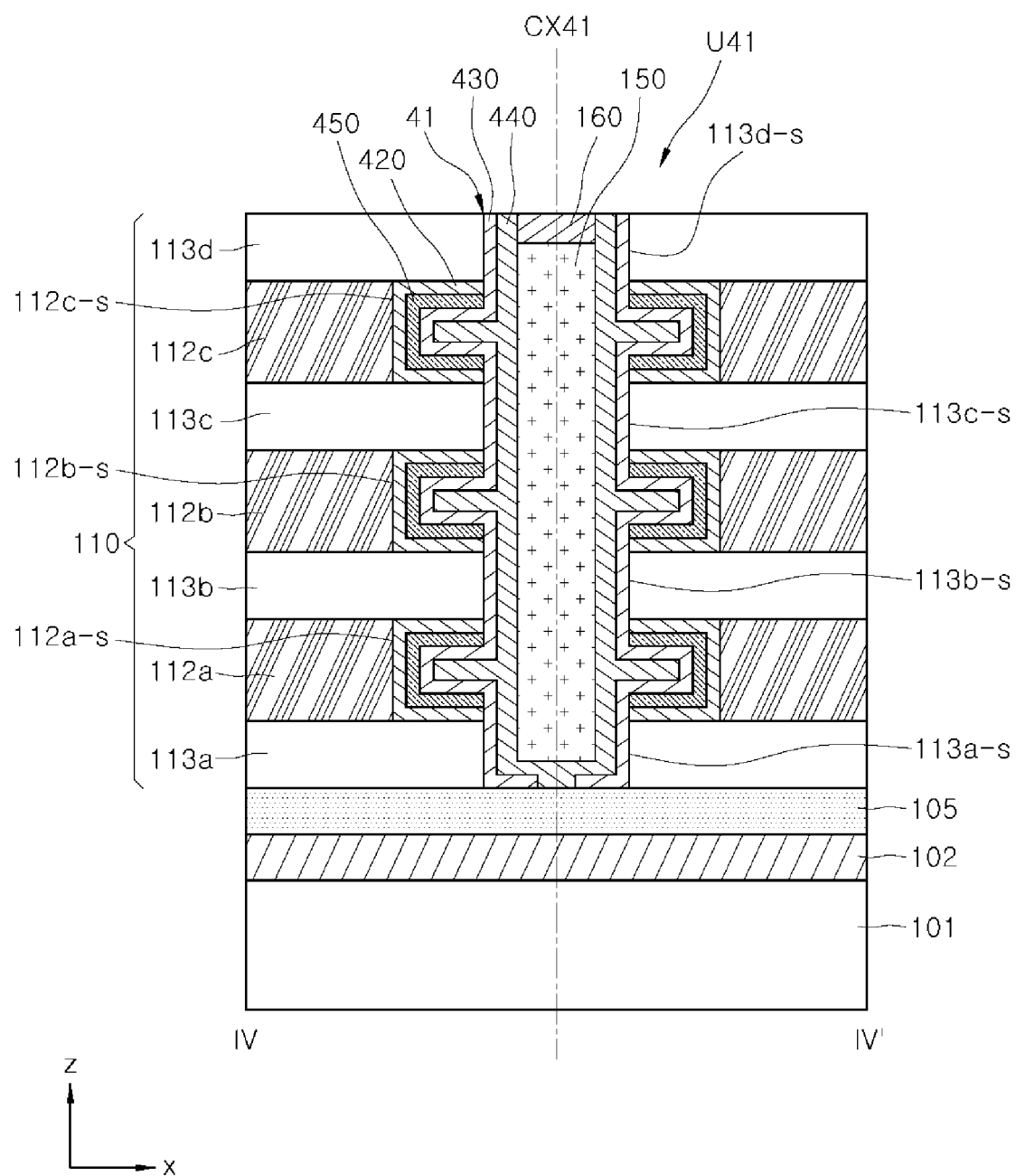
FIG. 10 is a cross-sectional view taken along a line IV-IV' of the semiconductor device of FIG. 9.

FIG. 9 is a perspective view schematically illustrating a semiconductor device 4 according to another embodiment of the present disclosure. FIG. 10 is a cross-sectional view taken along a line IV-IV' of the semiconductor device of FIG. 9.

Referring to FIGS. 9 and 10, the semiconductor device 4 may further include an electrical floating layer 450, compared to the semiconductor device 2 described above with reference to FIGS. 5 and 6. Other configurations of the semiconductor device 4 except for the electrical floating layer 450 may be substantially the same as those of the semiconductor device 2 above with reference to FIGS. 5 and 6. As an example, the configurations of a ferroelectric layer 420, an interfacial insulation layer 430, and a channel layer 440 of the semiconductor device 4 may be substantially the same as the configurations of the ferroelectric layer 220, the interfacial insulation layer 230, and the channel layer 240 of the semiconductor device 2 with reference to FIGS. 5 and 6. That is, each of the ferroelectric layer 420, the interfacial insulation layer 430, and the channel layer 440 may include protruding portions protruding in a direction away from the central axes CX41 and CX42 of first and second hole patterns 41 and 42. Referring to FIGS. 9 and 10, the semiconductor device 4 may include first and second memory element units U41 and U42 corresponding to the first and second hole patterns 41 and 42. The first and second memory element units U41 and U42 may have substantially the same configuration.

Referring to FIG. 10, the semiconductor device 4 may further include the electrical floating layer 450 disposed between the ferroelectric layer 420 and the interfacial insulation layer 430. The electrical floating layer 450 may be disposed to contact the ferroelectric layer 420. The electrical floating layer 450 may include a conductor. The electrical floating layer 450 may be electrically floated, and might not be electrically connected to the first to third gate electrode layers 112a, 112b, and 112c and the channel layer 440.

The electrical floating layer 450 may include sufficient amounts of electrons and holes that can flow inside the electrical floating layer 450. When the electrical floating layer 450 and the ferroelectric layer 420 form an interface, the electrical floating layer 450 can effectively cancel electrical charges accumulated in an inner region of the ferroelectric layer 420 adjacent to the interface. The electrical charges may be electrons or holes generated by the remanent polarization of the ferroelectric layer 420.

If the ferroelectric layer 420 and the interfacial insulation layer 430 are in direct contact with each other without the electric floating layer 450, then the ferroelectric layer 420 and the interfacial insulation layer 430 may form an interface. At this time, electrical charges may be accumulated by the remanent polarization of the ferroelectric layer 420 inside the ferroelectric layer 420 adjacent to the interface. If the interfacial insulation layer 430 is a dielectric layer having a paraelectric property, then the interfacial insulation layer 430 may not have a sufficient amount of opposite types of charges to cancel the charges accumulated inside the ferroelectric layer 420 based on a ferroelectric property of the ferroelectric layer 420.

As described above, when the charges accumulated in the ferroelectric layer 420 cannot be canceled by the charges of the opposite type in the interfacial insulation layer 430, the charges in the ferroelectric layer 420 may generate a depolarization electric field inside the ferroelectric layer 420.

Because the depolarization electric field is formed and oriented in an opposite direction against an orientation of the remanent polarization, the remanent polarization may be weakened. As a result, the depolarization electric field generated inside the ferroelectric layer 420, due to the charges that are not canceled by charges of the opposite type in the interfacial insulation layer 430, may degrade the ferroelectric properties of the ferroelectric layer 420.

In this embodiment, the electrical floating layer 450 advantageously provides electrons or holes, thereby forming electrical balance between different types of electric charges at the interface between the ferroelectric layer 420 and the electrical floating layer 450. Therefore, deterioration of the ferroelectric properties of the ferroelectric layer 420 generated by a depolarization electric field can be suppressed.

Figure 11:
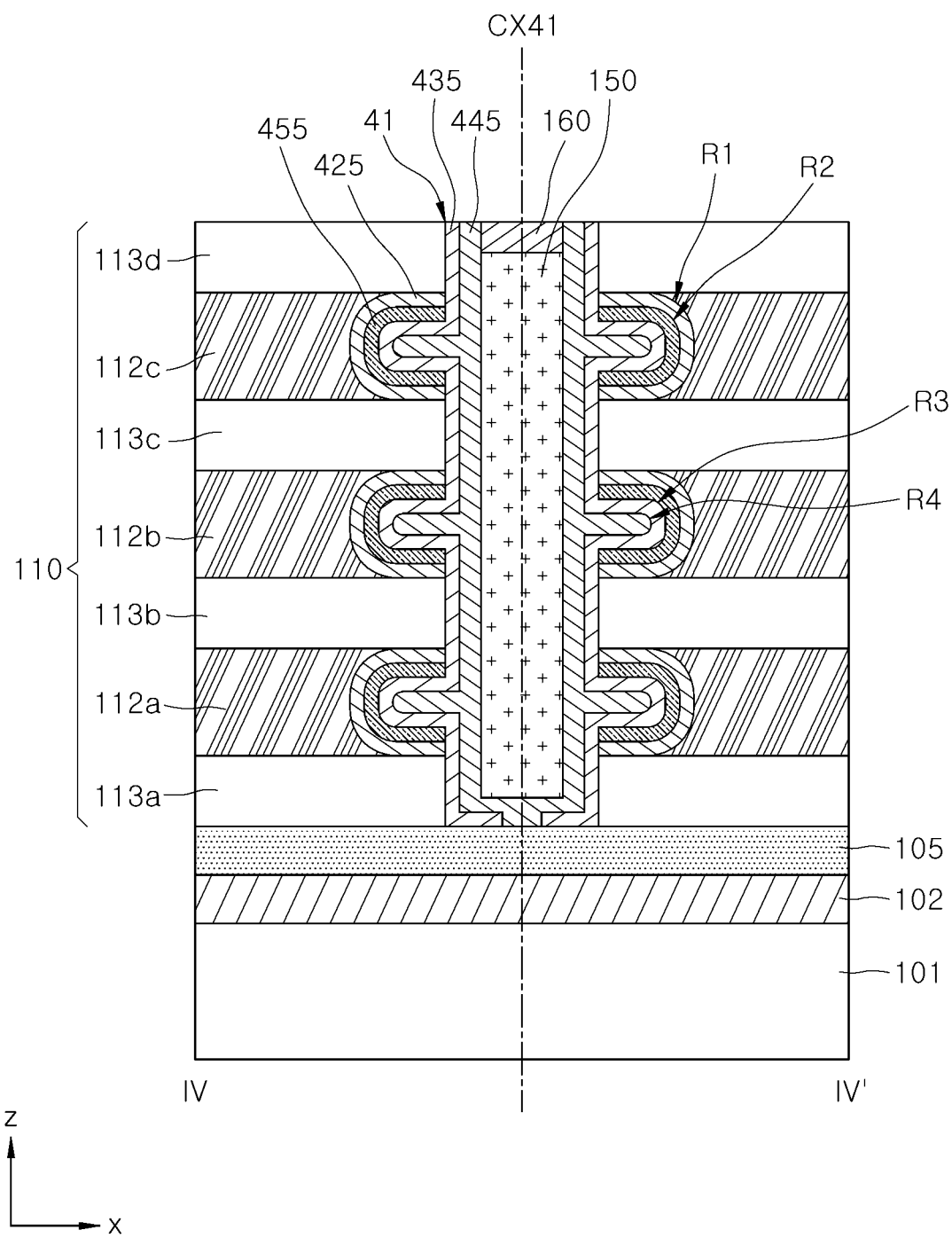
FIG. 11 is a cross-sectional view schematically illustrating a semiconductor device according to another embodiment of the present disclosure.

FIG. 11 is a cross-sectional view schematically illustrating a semiconductor device 4a according to another embodiment of the present disclosure. FIG. 11 is a cross-sectional view taken along a line IV-IV' of the semiconductor device of FIG. 9. The semiconductor device 4a of FIG. 11 may be a modification of the semiconductor device 4 described above with reference to FIGS. 9 and 10.

Referring to FIG. 11, the semiconductor device 4a may include a ferroelectric layer 425, an electrical floating layer 455, an interfacial insulation layer 435, and a channel layer 445. Among corner portions of the ferroelectric layer 425, the electrical floating layer 455, the interface insulating layer 435, and the channel layer 445, corner portions R1, R2, R3, and R4 disposed toward gate electrode layers 112a, 112b, and 112c may each have, for example, a round shape or an oval shape. That is, among the corner portions of the ferroelectric layer 425, the electrical floating layer 455, the interface insulating layer 435, and the channel layer 445, the corner portions R1, R2, R3, and R4 disposed toward the gate electrode layers 112a, 112b, and 112c do not have peaks or square edges, so that an electric field is not concentrated through the peaks or square edges when the semiconductor device 4a is operated. As a result, it is possible to suppress the occurrence of electrical breakdown due to an excessive concentration of an electric field at such peaks and edges, and to improve the durability of the semiconductor device 4a.

Among the corner portions of the ferroelectric layer 425, the electrical floating layer 455, the interfacial insulation layer 435, and the channel layer 445, the corner portions R1, R2, R3, and R4 disposed toward the gate electrode layers 112a, 112b, and 112c may be located in the protruding portions. The protruding portions of the ferroelectric layer 425, the electrical floating layer 455, the interfacial insulating layer 435, and the channel layer 445 protrude in a radial direction away from the central axes CX41 and CX42 of the first and second hole patterns 41 and 42.

The configuration of the present embodiment, that is, the configuration in which the shape of the corner portions of the thin films disposed toward the gate electrode layers 112a, 112b, and 112c do not have peaks, can be applied substantially the same in manner to other embodiments disclosed in the present application specification.

Figure 12:
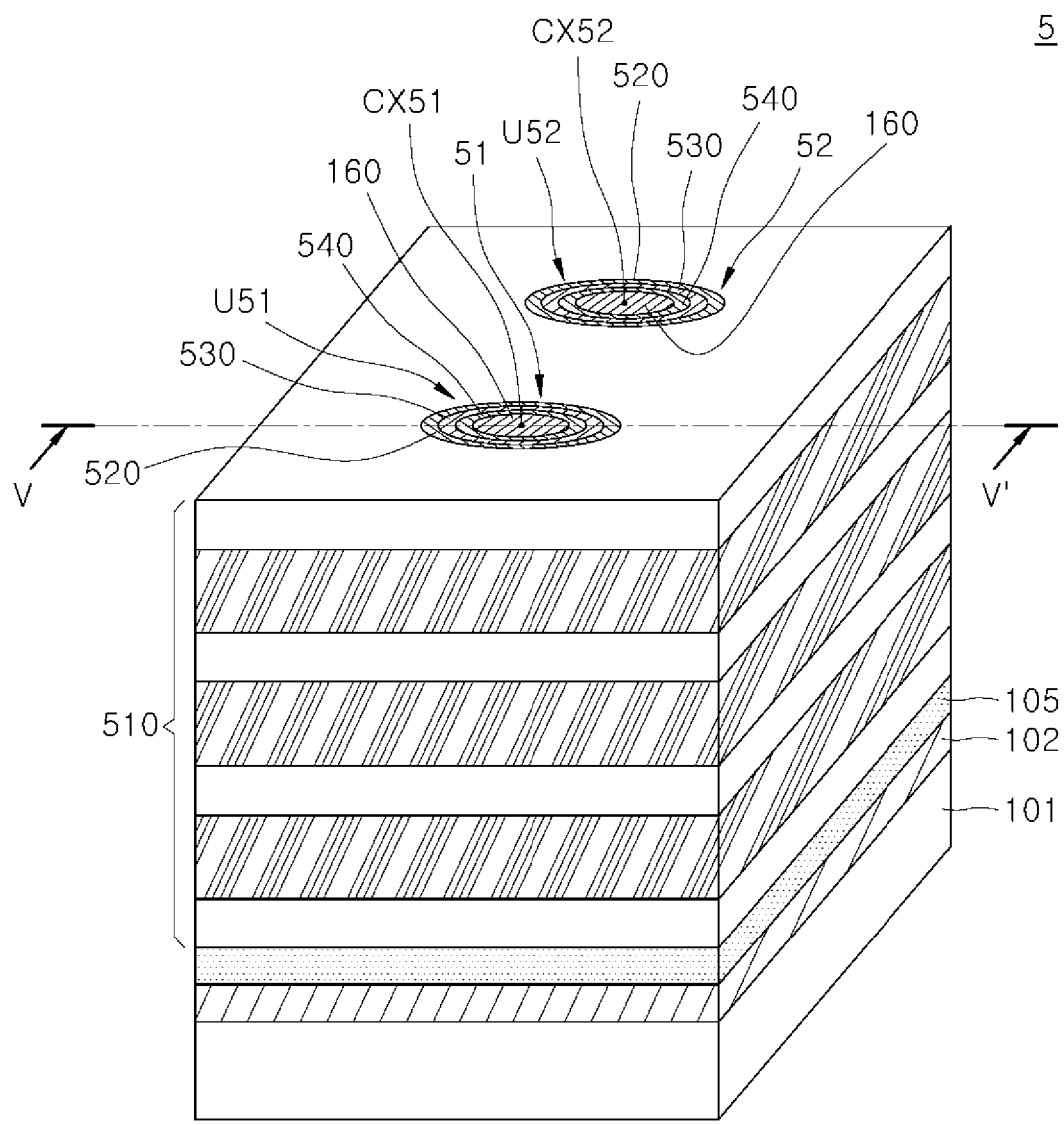
FIG. 12 is a perspective view schematically illustrating a semiconductor device according to another embodiment of the present disclosure.
Figure 13:
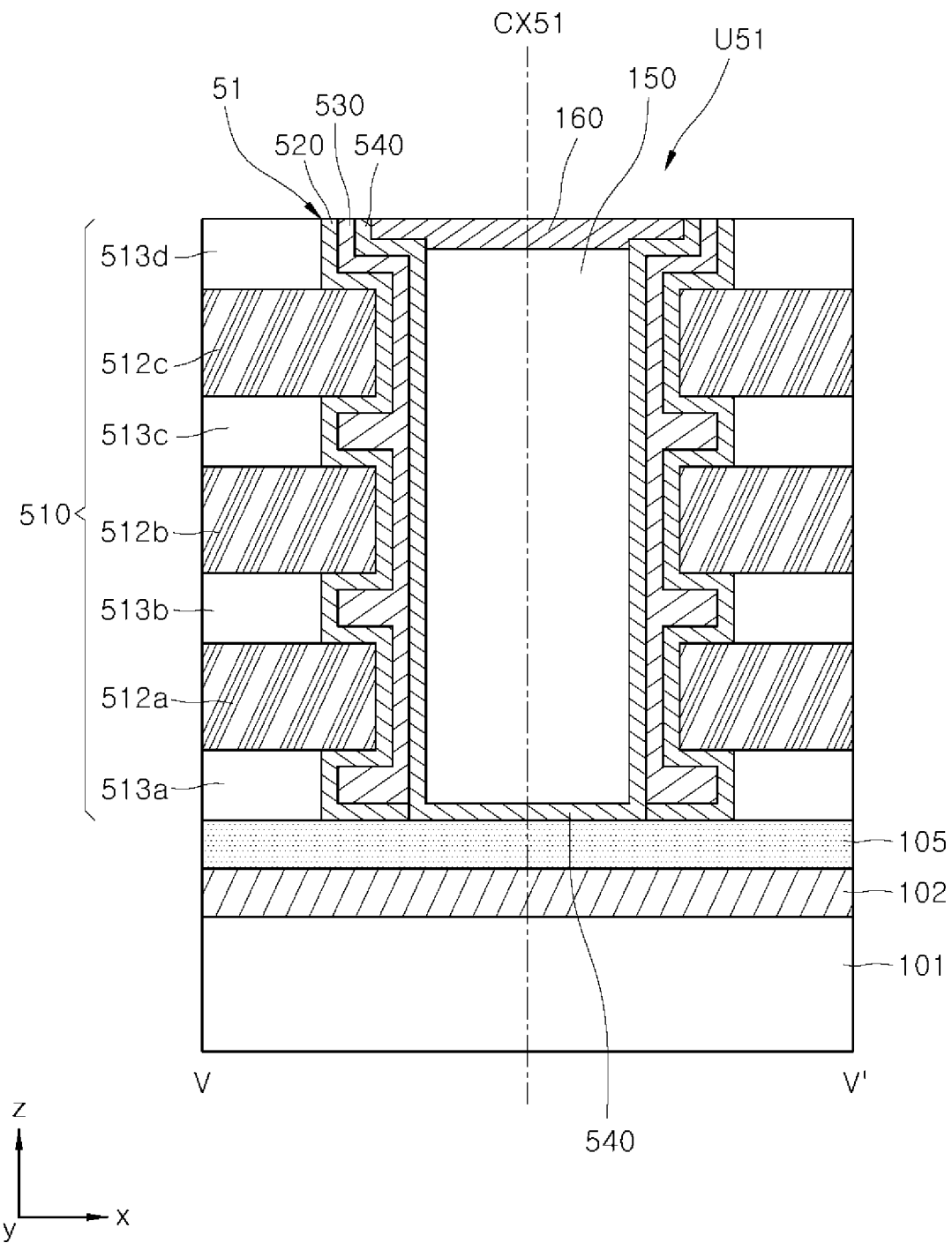
FIG. 13 is a cross-sectional view taken along a line V-V' of the semiconductor device of FIG. 12.

FIG. 12 is a perspective view schematically illustrating a semiconductor device 5 according to another embodiment of the present disclosure. FIG. 13 is a cross-sectional view taken along a line V-V' of the semiconductor device of FIG. 12.

Referring to FIGS. 12 and 13, the semiconductor device 5 may be different in the configuration of a gate structure 510, compared to the semiconductor device 1 described with reference to FIGS. 1 to 3. The rest of the configuration of the semiconductor device 5, except for the gate structure 510, may be substantially the same as that of the semiconductor device 1 described with reference to FIGS. 1 to 3.

The semiconductor device 5 may include the gate structure 510 disposed on a channel lower contact layer 105 and may include first and second hole patterns 51 and 52. The semiconductor device 5 may include first and second memory element units U51 and U52 corresponding to the first and second hole patterns 51 and 52. The first and second memory element units U51 and U52 may have substantially the same configuration.

The gate structure 510 may include first to third gate electrode layers 512a, 512b, and 512c and first to fourth interlayer insulation layers 513a, 513b, 513c, and 513d that are alternately stacked in the axial direction. The first to third gate electrode layers 512a, 512b, and 512c may protrude in the radial direction toward the central axes CX51 and CX52 of the first and second hole patterns 51 and 52, relative to the first to fourth interlayer insulation layers 513a, 513b, 513c, and 513d. The ferroelectric layer 520 may be disposed to cover the sidewall surface of the gate structure 510, and may include protruding portions protruding toward the central axes CX51 and CX52 of the first and second hole patterns 51 and 52. The protruding portions of the ferroelectric layer 520 may be disposed on the protruding portions of the first to third gate electrode layers 512a, 512b, and 512c. An interfacial insulation layer 530 and a channel layer 540 may be sequentially disposed on the ferroelectric layer 520. The material properties of the ferroelectric layer 520, the interfacial insulation layer 530, and the channel layer 540 may be substantially the same as those of the ferroelectric layer 120, the interfacial insulation layer 130, and the channel layer 140 described above with reference to FIGS. 1 to 3. The interfacial insulation layer 530 may contact the ferroelectric layer 520 and the channel layer 540 without contacting the channel lower contact layer 105. In some embodiments, the channel layer 540 may not have protruding portions. In some embodiments, only the ferroelectric layer 520 and the channel layer 540 may be disposed at the bottom of first and second hole patterns 51 and 52.

In the semiconductor device 5 of this embodiment, like the semiconductor device 1 described above with reference to FIGS. 1 to 3, the sidewall surface of the gate structure 510 may be formed in an uneven shape or a curved shape along the first direction. By arranging the ferroelectric layer 520 along the uneven shape or curved shape, it is possible to increase the area of the ferroelectric layer 520. Due to the increased area of the ferroelectric layer 520, the number of crystal grains distributed in the ferroelectric layer 520 may be increased when the ferroelectric layer 520 is formed under the same chemical process conditions. Because the unit polarization can be switched for each crystal grain within the ferroelectric layer 520, as the number of grains increases, the number of residual polarization states that the ferroelectric layer 520 can implement can be increased. The number of signal information implemented corresponding to the number of the states of the residual polarization increases, so that the memory storage performance of the semiconductor device 5 can be improved.

In some embodiments, the interfacial insulation layer 530 may be omitted. In some embodiments, a ferroelectric induction layer may be disposed between the first to third gate electrode layers 512a, 512b, and 512c and the ferroelectric layer 520. The configuration of the ferroelectric induction layer may be substantially the same as the configuration of the ferroelectric induction layer 350 described above with reference to FIGS. 7 and 8. In some embodiments, an electrical floating layer may be disposed between the ferroelectric layer 520 and the interfacial insulation layer 530. The configuration of the electrical floating layer may be substantially the same as the configuration of the electrical floating layer 450 described above with reference to FIGS. 9 and 10.

Figure 14:
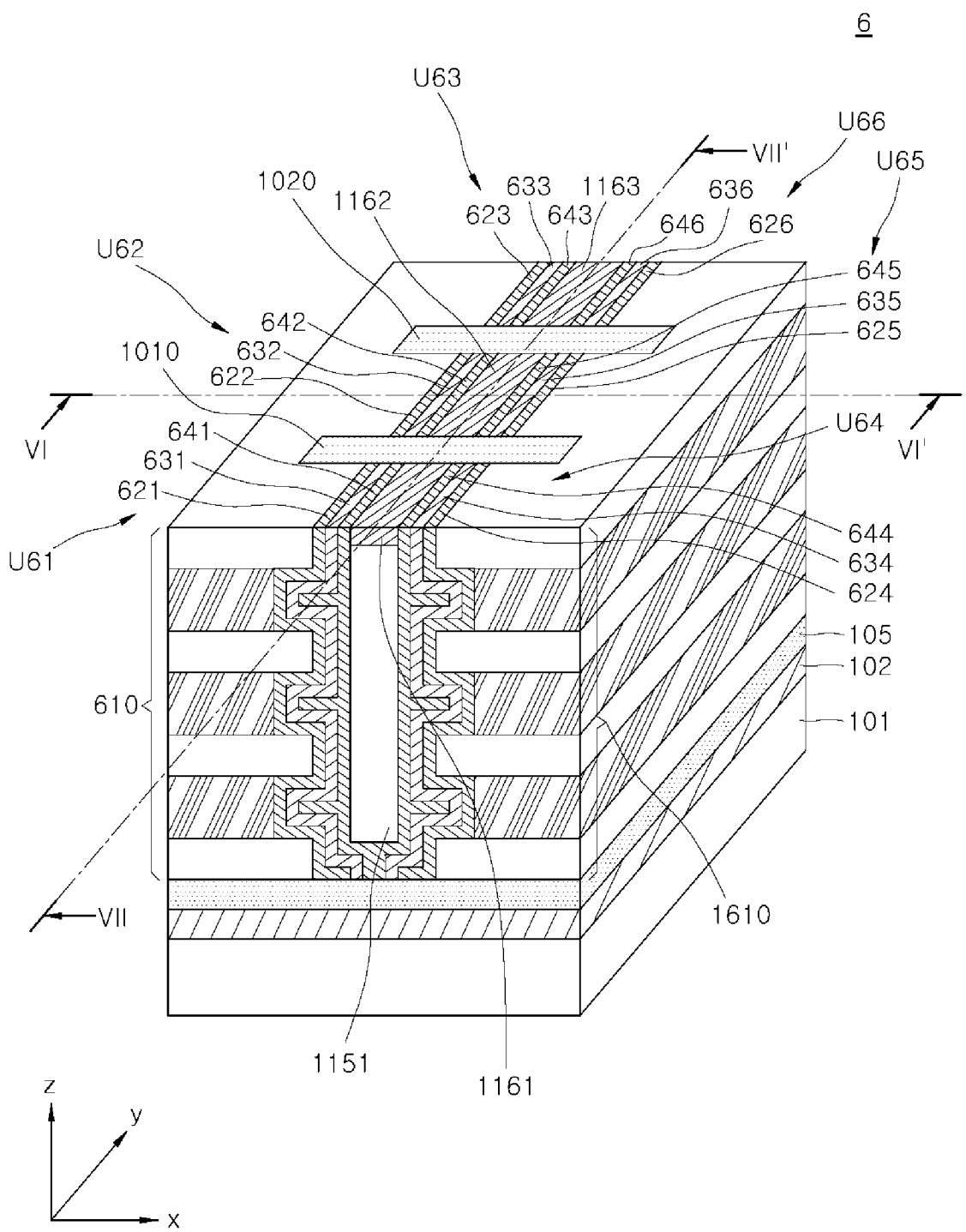
FIG. 14 is a perspective view schematically illustrating a semiconductor device according to another embodiment of the present disclosure.
Figure 15:
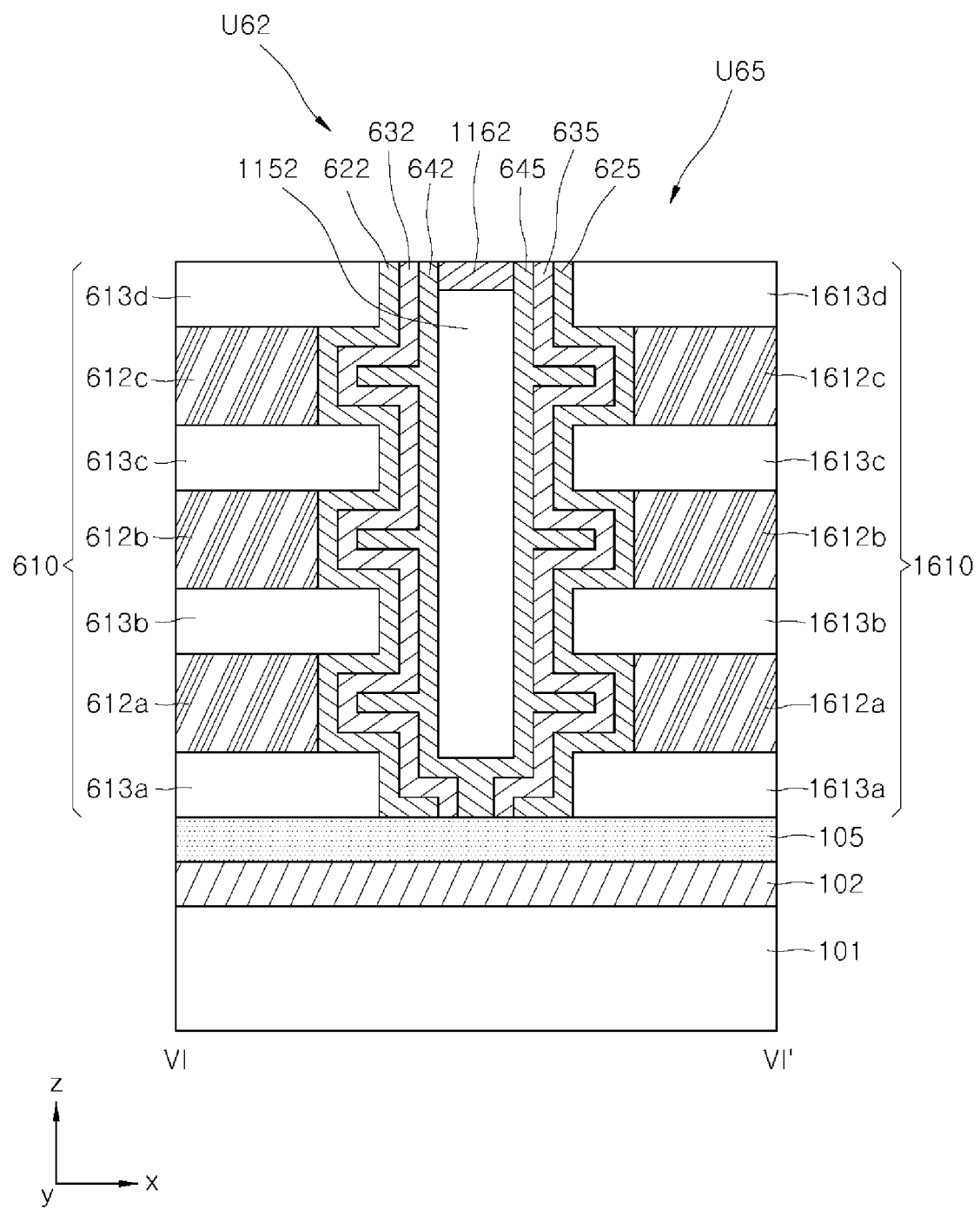
FIG. 15 is a cross-sectional view taken along a line VI-VI' of the semiconductor device of FIG. 14.
Figure 16:
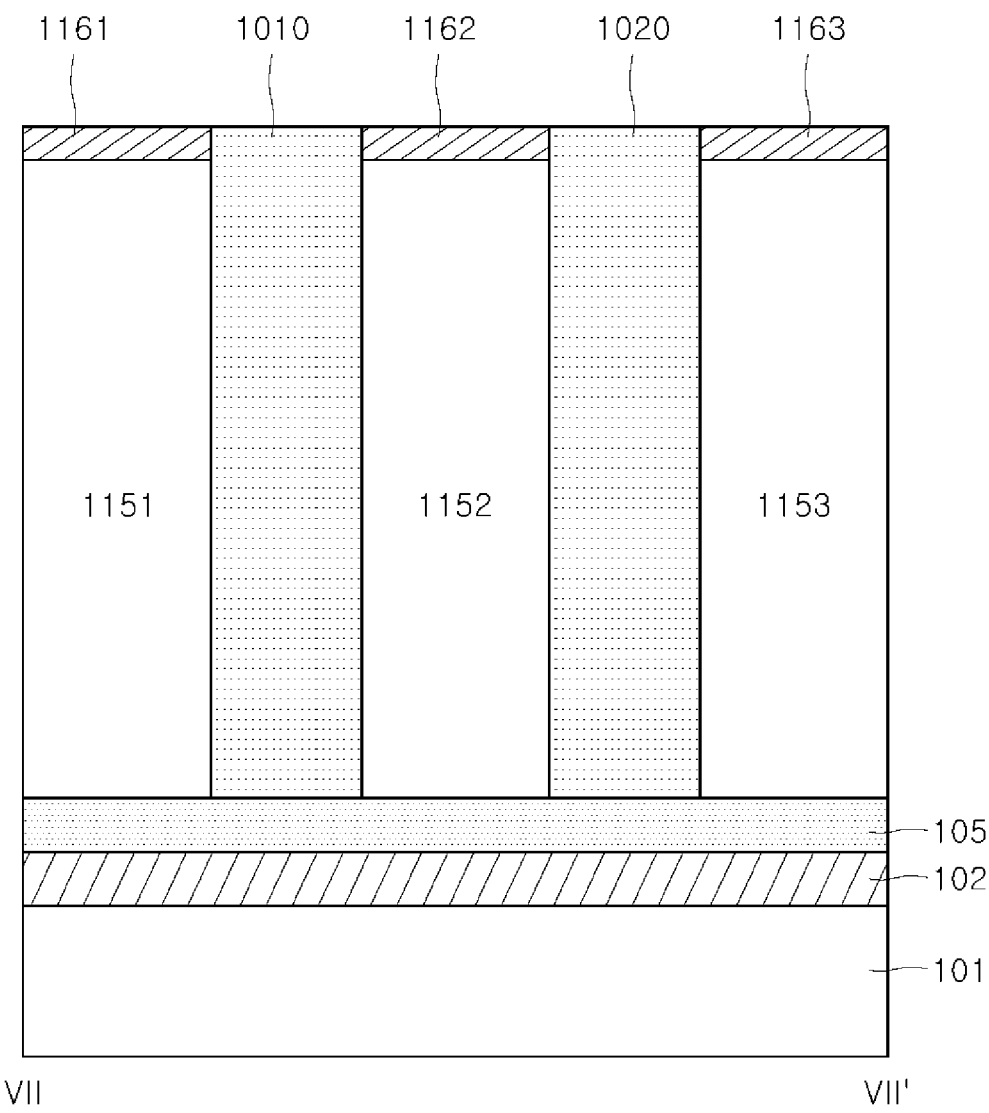
FIG. 16 is a cross-sectional view taken along a line VII-VII' of the semiconductor device of FIG. 14.

FIG. 14 is a perspective view schematically illustrating a semiconductor device 6 according to another embodiment of the present disclosure. FIG. 15 is a cross-sectional view taken along a line VI-VI' of the semiconductor device of FIG. 14. FIG. 16 is a cross-sectional view taken along a line VII-VII' of the semiconductor device of FIG. 14.

The semiconductor device 6 may include first to sixth memory element units U61, U62, U63, U64, U65, and U66 that are separated by first to third core insulation structures 1151, 1152, and 1153, and first and second cell isolation structures 1010 and 1020. The first to sixth memory element units U61, U62, U63, U64, U65, and U66 may be operated independently of each other.

Referring to FIGS. 14 to 16, the semiconductor device 6 may include a substrate 101, and first and second gate structures 610 and 1610 disposed to be spaced apart from each other over the substrate 101. In addition, the semiconductor device 6 may include a base insulation layer 102 and a channel lower contact layer 105 that are disposed between the substrate 101 and the first and second gate structures 610 and 1610. The channel lower contact layer 105 may be electrically connected to a source electrode (not illustrated).

The first and second gate structures 610 and 1610 may be disposed to be spaced apart from each other in a third direction (i.e., the x-direction) perpendicular to first and second directions. In addition, the first and second gate structures 610 and 1610 may extend in the second direction (i.e., the y-direction) perpendicular to the first direction. The first and second gate structures 610 and 1610 may be parallel to each other in the second direction (i.e., the y-direction).

The first gate structure 610 may include first to third gate electrode pattern layers 612a, 612b, and 612c and first to fourth interlayer insulation pattern layers 613a, 613b, 613c, and 613d that are alternately disposed along the first direction (i.e., the z-direction) perpendicular to the surface of the substrate 101. The first to fourth interlayer insulation pattern layers 613a, 613b, 613c, and 613d may protrude toward the third direction (i.e., the x-direction), compared to the first to third gate electrode pattern layers 612a, 612b, and 612c. Similarly, the second gate structure 1610 may include first to third gate electrode pattern layers 1612a, 1612b, and 1612c and first to fourth interlayer insulation pattern layers 1613a, 1613b, 1613c, and 1613d that are alternately disposed along the first direction (i.e., the z-direction) perpendicular to the surface of the substrate 101. The first to fourth interlayer insulation pattern layers 1613a, 1613b, 1613c, and 1613d may protrude toward the third direction (i.e., the x-direction), relative to the first to third gate electrode pattern layers 1612a, 1612b, and 1612c. Accordingly, each of the sidewall surfaces of the first and second gate structures 610 and 1610 may have an uneven shape or a curved shape along the first direction. Meanwhile, the protruding portions of the first to fourth interlayer insulation pattern layers 613a, 613b, 613c, and 613d and the protruding portions of the first to fourth interlayer insulation pattern layers 1613a, 1613b, 1613c, and 1613d may face each other in the third direction (i.e., the x-direction).

In addition, the semiconductor device 6 may include ferroelectric layers 621, 622, and 623, interfacial insulation layers 631, 632, and 633, and channel layers 641, 642, and 643, which are sequentially disposed along the sidewall surface of the first gate structure 610 on the channel lower contact layer 105. Similarly, the semiconductor device 6 may include ferroelectric layers 624, 625, and 626, interfacial insulation layers 634, 635, and 636, and channel layers 644, 645, and 646, which are sequentially disposed along the sidewall surface of the second gate structure 1610 on the channel lower contact layer 105.

The ferroelectric layers 621, 622, and 623, the interfacial insulation layers 631, 632, and 633, and the channel layers 641, 642, and 643 may be disposed to be spaced apart from each other, divided by cell isolation structures 1010 and 1020, with respect to the second direction (i.e., the y-direction). The ferroelectric layers 624, 625, and 626, interfacial insulation layers 634, 635, and 636, and the channel layers 644, 645, and 646 may be disposed to be spaced apart from each other, divided by the cell isolation structures 1010 and 1020, with respect to the second direction (i.e., the y-direction).

The configurations of the ferroelectric layers 621, 622, 623, 624, 625, and 626, the interfacial insulation layers 631, 632, 633, 634, 635, and 636, and the channel layers 641, 642, 643, 644, 645, and 646 may be substantially the same as those of the ferroelectric layer 120, the interfacial insulation layer 130, and the channel layer 140 of the semiconductor device 1 described above with reference to FIGS. 1 to 3.

In some embodiments, the interfacial insulation layers 631, 632, 633, 634, 635, and 636 may be omitted. In these cases, the ferroelectric layers 621, 622, 623, 624, 625, and 626 may contact the corresponding channel layers 641, 642, 643, 644, 645, and 646.

Referring to FIGS. 14 to 16, first to third core insulation structures 1151, 1152, and 1153 may be disposed between the first gate structure 610 and the second gate structure 1610. Channel upper contact layers 1161, 1162, and 1163, which are in contact with a pair of adjacent channel layers in the third direction (x-direction), may be disposed on the first to third core insulation structures 1151, 1152, and 1153, respectively. The channel upper contact layers 1161, 1162, and 1163 may be separated from each other by the cell isolation structures 1010 and 1020 with respect to the second direction (i.e., the y-direction). The channel upper contact layers 1161, 1162, and 1163 may be electrically connected to a drain electrode (not illustrated).

Referring to FIGS. 14 and 15, in this embodiment, the ferroelectric layers 621, 622, 623, 624, 625, and 626, the interfacial insulation layers 631, 632, 633, 634, 635, and 636, and the channel layers 641, 642, 643, 644, 645, and 646 are disposed along the sidewall surfaces of the first and second gate structures 610 and 1610 having an uneven shape or a curved shape, so that the ferroelectric layers 621, 622, 623, 624, 625, and 626, the interfacial insulation layers 631, 632, 633, 634, 635, and 636, and the channel layers 641, 642, 643, 644, 645, and 646 may have protruding portions corresponding to the uneven or curved shape. The ferroelectric layers 621, 622, 623, 624, 625, and 626 have increased area corresponding to the protruding portions, so that the ferroelectric layers 621, 622, 623, 624, 625, and 626 can increase the states of the controllable remanent polarization in proportion to the increased area, as described in connection with the semiconductor device 1 of FIGS. 1 to 3. As a result, the increased number of pieces of signal information stored in the ferroelectric layers 621, 622, 623, 624, 625, and 626 increases the size of a memory window, which can improve the memory performance of the semiconductor device 6.

In embodiments contemplated by this disclosure, variations of the semiconductor device 6 may include one or more features described with respect to FIGS. 1 to 13 above. As non-limiting examples, the interfacial insulation layers 631, 632, 633, 634, 635, and 636 may be omitted; ferroelectric layers 621, 622, 623, 624, 625, and 626 may have the cross-sectional configuration of the ferroelectric layer 220 in the semiconductor device 2 described above with respect to FIGS. 5 and 6; semiconductor device 6 may include a ferroelectric induction layer such as the ferroelectric induction layer 350 in the semiconductor device 3 described above with reference to FIGS. 7 and 8; semiconductor device 6 may include an electrical floating layer such as electrical floating layer 450 of the semiconductor device 4 described above with reference to FIGS. 9 and 10; and semiconductor device 6 may include corner portions such as corner portions R1, R2, R3, and R4 of the semiconductor device 4a described above with reference to FIG. 11.

Figure 17:
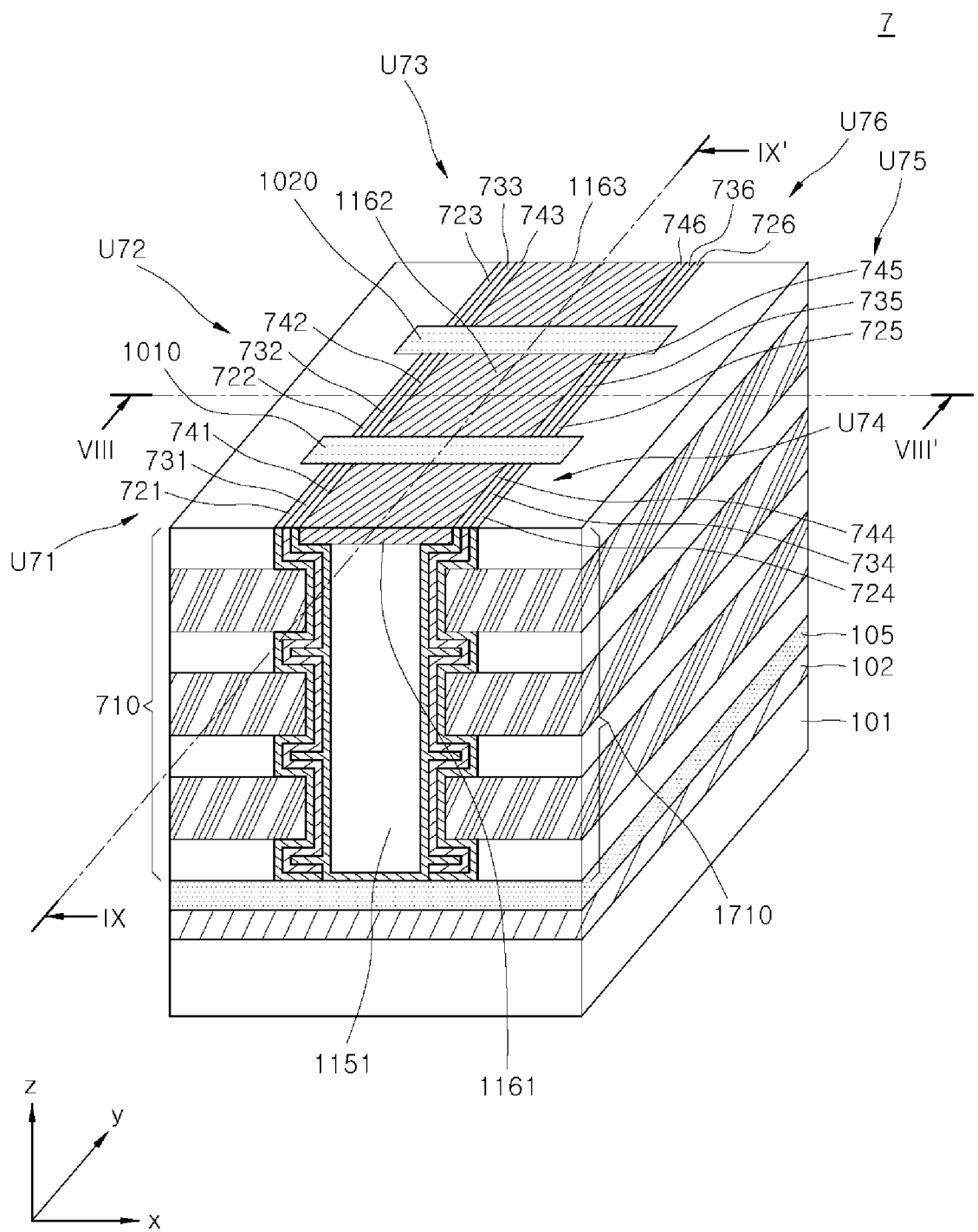
FIG. 17 is a perspective view schematically illustrating a semiconductor device according to another embodiment of the present disclosure.
Figure 18:
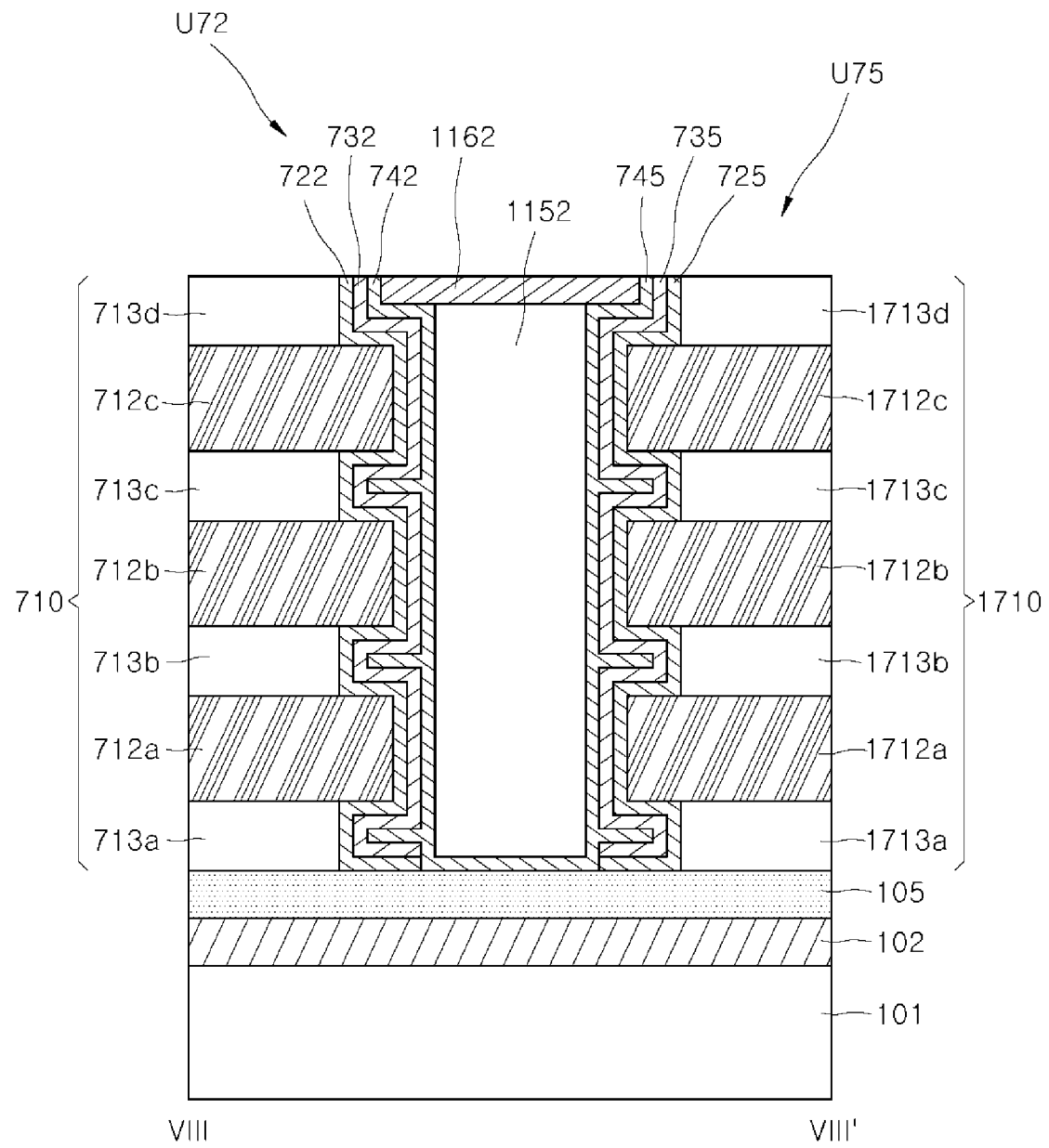
FIG. 18 is a cross-sectional view taken along a line VIII-VIII' of the semiconductor device of FIG. 17.
Figure 19:
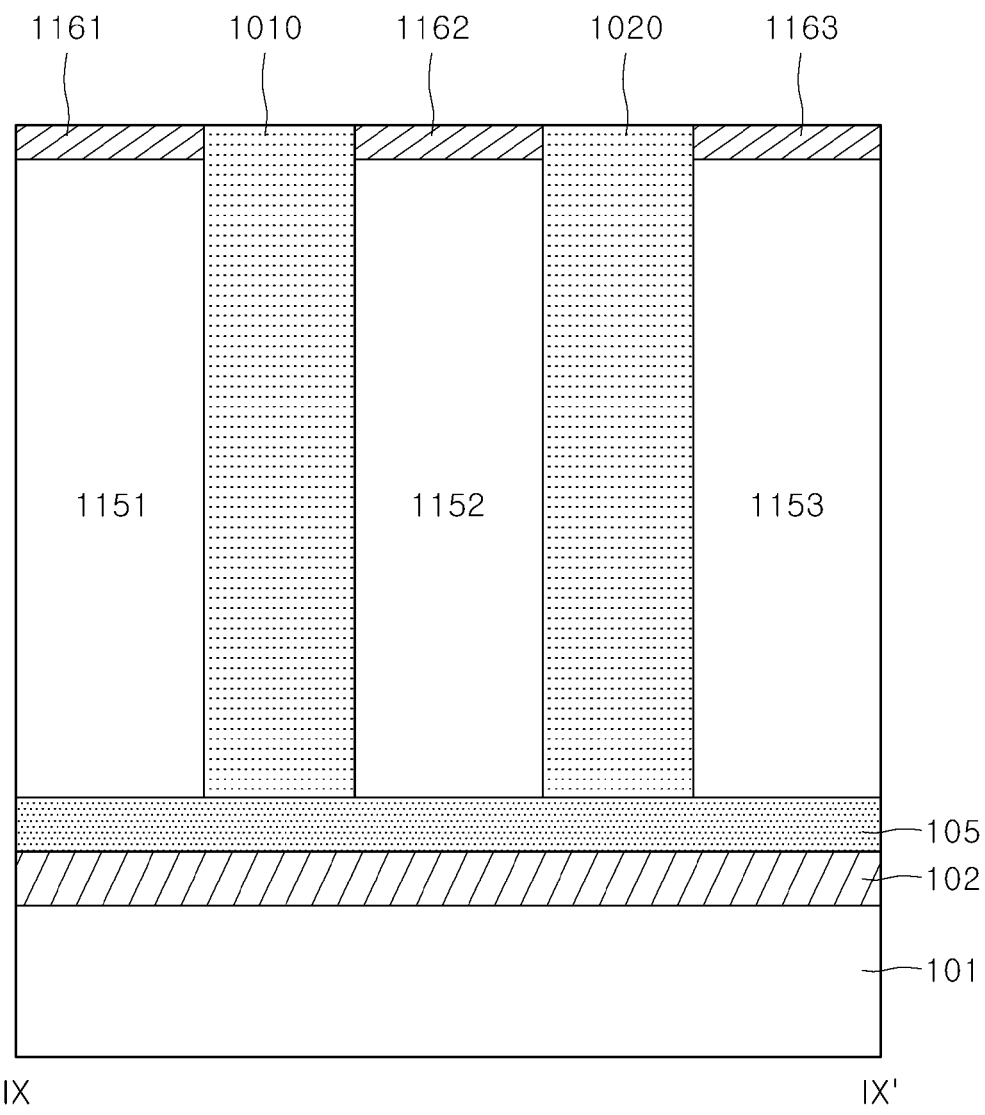
FIG. 19 is a cross-sectional view taken along a line IX-IX' of the semiconductor device of FIG. 17.

FIG. 17 is a perspective view schematically illustrating a semiconductor device 7 according to another embodiment of the present disclosure. FIG. 18 is a cross-sectional view taken along a line VIII-VIII' of the semiconductor device of FIG. 17. FIG. 19 is a cross-sectional view taken along a line IX-IX' of the semiconductor device of FIG. 17.

The semiconductor device 7 may include first to sixth memory element units U71, U72, U73, U74, U75, and U76 separated from each other by first to third core insulation structures 1151, 1152, and 1153 and first and second cell separation structures 1010 and 1020. The first to sixth memory element units U71, U72, U73, U74, U75, and U76 may be operated independently of each other.

Referring to FIGS. 17 to 19, the semiconductor device 7 may be different in the configurations of first and second gate structures 710 and 1710, compared to the semiconductor device 6 described above with reference to FIGS. 14 to 16. The rest of the configuration of the semiconductor device 7, except for the first and second gate structures 710 and 1710, may be substantially the same as that of the semiconductor device 6 described above with reference to FIGS. 14 to 16.

The first gate structure 710 may include first to third gate electrode pattern layers 712a, 712b, and 712c, and first to fourth interlayer insulation pattern layers 713a, 713b, 713c, and 713d, which are alternately stacked along a first direction (i.e., z-direction) perpendicular to the surface of the substrate 101. The first to third gate electrode pattern layers 712a, 712b, and 712c may protrude in a third direction (i.e., x-direction), relative to the first to fourth interlayer insulation pattern layers 713a, 713b, 713c, and 713d. Similarly, the second gate structure 1710 may include first to third gate electrode pattern layers 1712a, 1712b, and 1712c, and first to fourth interlayer insulation layers 1713a, 1713b, 1713c, and 1713d, which are alternately stacked along the first direction (i.e., z-direction) perpendicular to the surface of the substrate 101. The first to third gate electrode pattern layers 1712a, 1712b, and 1712c may protrude in the third direction (i.e., x-direction), compared to the first to fourth interlayer insulation layers 1713a, 1713b, 1713c, and 1713d. Accordingly, each of the sidewalls of the first and second gate structures 710 and 1710 may have an uneven shape or a curved shape along the first direction. In this embodiment, the protruding portions of the first to third gate electrode pattern layers 712a, 712b, and 712c and the protruding portions of the first to third gate electrode pattern layers 1712a, 1712b, and 1712c may be disposed to face each other in the third direction (i.e., x-direction).

Referring to FIGS. 17 and 18, in this embodiment, ferroelectric layers 721, 722, 723, 724, 725, and 726, interfacial insulation layers 731, 732, 733, 734, 735, and 736, and channel layers 741, 742, 743, 744, 745, and 746 are disposed along the sidewall surfaces of the first and second gate structures 710 and 1710 having an uneven shape or a curved shape, so that the ferroelectric layers 721, 722, 723, 724, 725, and 726, the interfacial insulation layers 731, 732, 733, 734, 735, and 736, and the channel layers 741, 742, 743, 744, 745, and 746 may have protruding portions corresponding to the uneven shape or the curved shape. The ferroelectric layers 721, 722, 723, 724, 725, and 726 have increased area corresponding to the protruding portions, so that the ferroelectric layers 721, 722, 723, 724, 725, and 726 can increase the states of the controllable remanent polarization in proportion to the increased area, as described in connection with the semiconductor device 1 of FIGS. 1 to 3. Consequently, the number of pieces of signal information stored in the ferroelectric layers 721, 722, 723, 724, 725, and 726 can be increased, which increases a memory window size and improves a memory performance of the semiconductor device 7.

In some embodiments (not illustrated) contemplated by this disclosure, variations of the semiconductor device 7 may include one or more features described with respect to FIGS. 1 to 13 above. As non-limiting examples, the interfacial insulation layers 731, 732, 733, 734, 735, and 736 may be omitted; ferroelectric layers 721, 722, 723, 724, 725, and 726 may have the cross-sectional configuration of the ferroelectric layer 220 in the semiconductor device 2 described above with respect to FIGS. 5 and 6; semiconductor device 7 may include a ferroelectric induction layer such as the ferroelectric induction layer 350 in the semiconductor device 3 described above with reference to FIGS. 7 and 8; semiconductor device 7 may include an electrical floating layer such as the electrical floating layer 450 of the semiconductor device 4 described above with reference to FIGS. 9 and 10; semiconductor device 7 may include corner portions such as the corner portions R1, R2, R3, and R4 of the semiconductor device 4a described above with reference to FIG. 11.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising:
   a substrate;
   a gate structure disposed over the substrate and comprising
   a hole pattern comprising a central axis extending in a direction perpendicular to a surface of the substrate, and
   a gate electrode layer and an interlayer insulation layer, which are alternately stacked along the central axis;
   a ferroelectric layer disposed adjacent to a sidewall surface of the gate electrode layer inside the hole pattern; and
   a channel layer disposed adjacent to the ferroelectric layer inside the hole pattern,
   wherein one of the gate electrode layer and the interlayer insulation layer protrudes toward the central axis of the hole pattern, relative to the other one of the gate electrode layer and the interlayer insulation layer,
   wherein the semiconductor device further comprises:

a channel lower contact layer disposed between the substrate and the gate structure, and the channel lower contact layer electrically connected to a source electrode; and
a channel upper contact layer disposed over the channel lower contact layer, and the channel upper contact layer electrically connected to a drain electrode,
wherein the channel lower contact layer and the channel upper contact layer are electrically connected to both ends of the channel layer in the direction perpendicular to the surface of the substrate.

2. The semiconductor device of claim 1, further comprising an interfacial insulation layer disposed between the ferroelectric layer and the channel layer inside the hole pattern.

3. The semiconductor device of claim 2, wherein the gate electrode layer contacts the ferroelectric layer in a direction parallel to the surface of the substrate, and the interlayer insulation layer contacts the interfacial insulation layer in the direction parallel to the surface of the substrate.

4. The semiconductor device of claim 2, further comprising an electrical floating layer disposed between the ferroelectric layer and the interfacial insulation layer, wherein the electrical floating layer includes a conductor.

5. The semiconductor device of claim 4, wherein the electrical floating layer is disposed to contact the ferroelectric layer.

6. The semiconductor device of claim 1, further comprising a ferroelectric induction layer disposed between the gate electrode layer and the ferroelectric layer.

7. The semiconductor device of claim 6, wherein the ferroelectric induction layer comprises metal or conductive metal nitride.

8. The semiconductor device of claim 6, wherein the ferroelectric induction layer is disposed between a pair of neighboring interlayer insulation layers in the direction perpendicular to the surface of the substrate and disposed to contact the ferroelectric layer.

9. The semiconductor device of claim 1, wherein the interlayer insulation layer protrudes, relative to the gate electrode layer, toward the central axis of the hole pattern, and the ferroelectric layer comprises a portion protruding toward the gate electrode layer in the opposite direction.

10. The semiconductor device of claim 1, wherein a portion of the ferroelectric layer and a portion of the channel layer disposed to protrude toward the gate electrode layer include corner portions with a round shape or an oval shape.

11. The semiconductor device of claim 1, wherein the gate electrode layer protrudes toward the central axis of the hole pattern, relative to the interlayer insulation layer, and the ferroelectric layer comprises a portion protruding toward the central axis of the hole pattern.

12. A semiconductor device comprising:
a substrate;
a gate structure disposed over the substrate, the gate structure comprising a gate electrode pattern layer and an interlayer insulation pattern layer that are alternately stacked along a first direction perpendicular to a surface of the substrate, the gate structure extending in a second direction perpendicular to the first direction;
a ferroelectric layer disposed adjacent to a sidewall surface of the gate electrode pattern layer and disposed over the substrate; and
a channel layer disposed adjacent to the ferroelectric layer over the substrate and extending along a sidewall surface of the gate structure,
wherein one of the gate electrode pattern layer and the interlayer insulation pattern layer protrudes in a third direction perpendicular to the first and second directions, relative to the other one of the gate electrode pattern layer and the interlayer insulation pattern layer,
wherein the semiconductor device further comprises:
a channel lower contact layer disposed between the substrate and the gate structure, and the channel lower contact layer electrically connected to a source electrode; and
a channel upper contact layer disposed over the channel lower contact layer, and the channel upper contact layer electrically connected to a drain electrode,
wherein the channel lower contact layer and the channel upper contact layer are electrically connected to both ends of the channel layer in the first direction perpendicular to the surface of the substrate.

13. The semiconductor device of claim 12, further comprising an interfacial insulation layer, disposed between the ferroelectric layer and the channel layer, and extending along the sidewall surface of the gate structure.

14. The semiconductor device of claim 13, wherein the gate electrode pattern layer contacts the ferroelectric layer in a direction parallel to the surface of the substrate, and the interlayer insulation pattern layer contacts the interfacial insulation layer in the direction parallel to the surface of the substrate.

15. The semiconductor device of claim 13, further comprising an electrical floating layer disposed between the ferroelectric layer and the interfacial insulation layer, wherein the electrical floating layer comprises a conductor.

16. The semiconductor device of claim 12, further comprising a ferroelectric induction layer disposed between the gate electrode pattern layer and the ferroelectric layer.

17. The semiconductor device of claim 16, wherein the ferroelectric induction layer is disposed to contact the ferroelectric layer, between a pair of neighboring interlayer insulation pattern layers, in the first direction.

18. The semiconductor device of claim 12, wherein the interlayer insulation pattern layer protrudes toward the third direction, relative to the gate electrode pattern layer, and the ferroelectric layer comprises a portion protruding toward the sidewall surface of the gate electrode pattern layer.

19. The semiconductor device of claim 12, wherein a portion of the ferroelectric layer and a portion of the channel layer disposed to extend toward the gate electrode pattern layer include corner portions with a round shape or an oval shape.

20. The semiconductor device of claim 12, wherein the gate electrode pattern layer protrudes in the third direction, relative to the interlayer insulation pattern layer, and the ferroelectric layer comprises a portion disposed on a protruding portion of the gate electrode pattern layer.

* * * * *